US010766233B2

(12) United States Patent
Tsukamoto

(10) Patent No.: US 10,766,233 B2
(45) Date of Patent: *Sep. 8, 2020

(54) LAMINATE, METHOD FOR PRODUCING SUBSTRATE WITH PATTERNED PLATED LAYER, METHOD FOR PRODUCING METAL LAYER-CONTAINING LAMINATE, TOUCH PANEL SENSOR, AND TOUCH PANEL

(71) Applicant: FUJIFILM Corporation, Tokyo (JP)

(72) Inventor: Naoki Tsukamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 124 days.

This patent is subject to a terminal disclaimer.

(21) Appl. No.: 16/132,503

(22) Filed: Sep. 17, 2018

(65) Prior Publication Data

US 2019/0016101 A1 Jan. 17, 2019

Related U.S. Application Data

(63) Continuation of application No. PCT/JP2017/005269, filed on Feb. 14, 2017.

(30) Foreign Application Priority Data

Mar. 23, 2016 (JP) .................................. 2016-059242

(51) Int. Cl.
  *B32B 27/00* (2006.01)
  *B32B 27/18* (2006.01)
  (Continued)

(52) U.S. Cl.
  CPC .............. *B32B 27/18* (2013.01); *B32B 27/00* (2013.01); *C08J 5/18* (2013.01); *C08J 7/04* (2013.01);
  (Continued)

(58) Field of Classification Search
  CPC .. B32B 27/18; C08J 7/0423; C08J 7/04; C08J 5/18; C08L 67/02; C08L 69/00;
  (Continued)

(56) References Cited

U.S. PATENT DOCUMENTS 8,202,576 B2   6/2012  Inoue et al.
8,273,463 B2   9/2012  Tsurumi
(Continued)

FOREIGN PATENT DOCUMENTS

JP    2006-135271 A    5/2006
JP    2009-007540 A    1/2009
(Continued)

OTHER PUBLICATIONS

International Search Report issued in PCT/JP2017/005269; dated May 16, 2017.
Written Opinion issued in PCT/JP2017/005269; dated May 16, 2017.

*Primary Examiner* — Elizabeth E Mulvaney
(74) *Attorney, Agent, or Firm* — Studebaker & Brackett PC

(57) ABSTRACT

The present invention provides a laminate with which a metal layer-containing laminate with the occurrence of pattern thickening being suppressed can be obtained. Further, the present invention provides methods for producing a substrate with a patterned plated layer and a metal layer-containing laminate, as well as a touch panel sensor and a touch panel.
The laminate of the present invention is a laminate including a substrate, a plated layer forming layer, and a temporary protective film in this order, in which the plated layer forming layer contains a polymerization initiator and Compound X or Composition Y, and an absorption edge $\lambda_o$ on the long wavelength side of an ultraviolet-visible absorption spectrum of the temporary protective film, an absorption (Continued)

edge $\lambda_1$ on the long wavelength side of an ultraviolet-visible absorption spectrum of the polymerization initiator, and an absorption edge $\lambda_2$ on the long wavelength side of an ultraviolet-visible absorption spectrum of the substrate satisfy the relationship represented by Expression (Z).

14 Claims, 3 Drawing Sheets

(51) Int. Cl.
    *G03F 7/027*     (2006.01)
    *G03F 7/038*     (2006.01)
    *G03F 7/11*     (2006.01)
    *G03F 7/033*     (2006.01)
    *C08J 5/18*     (2006.01)
    *C08J 7/04*     (2020.01)
    *G06F 3/044*     (2006.01)
    *C08L 67/02*     (2006.01)
    *C08L 69/00*     (2006.01)

(52) U.S. Cl.
    CPC ............ *C08J 7/0423* (2020.01); *C08L 67/02* (2013.01); *C08L 69/00* (2013.01); *G03F 7/027* (2013.01); *G03F 7/033* (2013.01); *G03F 7/0388* (2013.01); *G03F 7/11* (2013.01); *G06F 3/044* (2013.01); *C08J 2367/02* (2013.01); *C08J 2433/14* (2013.01)

(58) Field of Classification Search
    CPC ........ G03F 7/033; G03F 7/027; G03F 7/0388; G03F 7/11
    See application file for complete search history.

(56) References Cited

U.S. PATENT DOCUMENTS

| | | |
|---|---|---|
| 8,293,846 B2 | 10/2012 | Kano et al. |
| 2009/0269599 A1 | 10/2009 | Tsurumi |
| 2010/0080893 A1 | 4/2010 | Inoue et al. |
| 2010/0080964 A1 | 4/2010 | Kano et al. |

FOREIGN PATENT DOCUMENTS

| | | |
|---|---|---|
| JP | 2009-280905 A | 12/2009 |
| JP | 2010-084196 A | 4/2010 |
| JP | 2010-248464 A | 11/2010 |
| JP | 2011-186208 A | 9/2011 |
| JP | 2012-097296 A | 5/2012 |
| JP | 2012-194534 A | 10/2012 |

LAMINATE, METHOD FOR PRODUCING SUBSTRATE WITH PATTERNED PLATED LAYER, METHOD FOR PRODUCING METAL LAYER-CONTAINING LAMINATE, TOUCH PANEL SENSOR, AND TOUCH PANEL

CROSS-REFERENCE TO RELATED APPLICATIONS

This application is a Continuation of PCT International Application No. PCT/JP2017/005269 filed on Feb. 14, 2017, which claims priority under 35 U.S.C. § 119(a) to Japanese Patent Application No. 2016-059242 filed on Mar. 23, 2016. The above application is hereby expressly incorporated by reference, in its entirety, into the present application.

BACKGROUND OF THE INVENTION

1. Field of the Invention

The present invention relates to a laminate, a method for producing a substrate with a patterned plated layer, a method for producing a metal layer-containing laminate, a touch panel sensor, and a touch panel.

2. Description of the Related Art

A metal layer-containing laminate including wiring made of a metal layer formed in a pattern shape on the surface of an insulating substrate is used for electronic parts such as touch panel sensors and touch panels, semiconductor elements, and the like. JP2010-248464A discloses a "plated layer forming composition including a polymer containing a non-dissociable functional group capable of forming an interaction with a plating catalyst or a precursor thereof, a radically polymerizable group, and an ionic polar group", and a "method for producing a metal pattern material including (1) a step of bringing a plated layer forming composition into contact with a substrate, and then applying energy in a patternwise manner to the plated layer forming composition to cure the plated layer forming composition in a region to which energy is applied, (2) a step of developing a region to which no energy is applied in the plated layer forming composition on the substrate with an aqueous solution to form a patterned plated layer, (3) a step of applying a plating catalyst or a precursor thereof to the patterned plated layer, and (4) a step of subjecting the plating catalyst or the precursor thereof to plating".

According to the plated layer forming composition described in JP2010-248464A, it is possible to form a plated layer which can be developed with an aqueous solution and has excellent absorptivity to a plating catalyst or a precursor thereof. In addition, according to the method for producing a metal pattern material described in JP2010-248464A, it is possible to easily form a metal pattern having excellent adhesiveness to a substrate using development with an aqueous solution.

SUMMARY OF THE INVENTION

In the case where a photo mask having a predetermined pattern shape is brought into close contact with a laminate produced using the plated layer forming composition described in JP2010-248464A and the laminate is irradiated with light and then developed, a plated layer to which the opening pattern of the photo mask is transferred can be formed on the substrate (this substrate will hereinafter be referred to as "substrate with a patterned plated layer").

The present inventors have found that the yield of the substrate with a patterned plated layer can be further improved by disposing a temporary protective film between the photo mask and the plated layer forming layer, followed by exposure and then development. In other words, the present inventors have found that the yield of the substrate with a patterned plated layer can be further improved by a laminate including a temporary protective film.

However, the present inventors have also found that, in the substrate with a patterned plated layer produced by using the laminate including a temporary protective film, a new problem arises in that the metal wiring pattern of the obtained metal layer-containing laminate becomes thicker (pattern thickening occurs) with respect to the opening pattern of the photo mask.

Therefore, an object of the present invention is to provide a laminate with which a metal layer-containing laminate with the occurrence of pattern thickening being suppressed can be obtained. Another object of the present invention is to provide methods for producing a substrate with a patterned plated layer and a metal layer-containing laminate, as well as a touch panel sensor and a touch panel.

As a result of extensive studies to achieve the foregoing objects, the present inventors have found that the foregoing objects can be achieved with a laminate including a substrate, a plated layer forming layer, and a temporary protective film in this order, and by controlling the light absorption characteristics of the substrate, a polymerization initiator contained in the plated layer forming layer, and the temporary protective film.

That is, it has been found that the foregoing objects can be achieved by the following configuration.

[1] A laminate comprising, in order, a substrate, a plated layer forming layer, and a temporary protective film, in which the plated layer forming layer contains a polymerization initiator and Compound X or Composition Y shown below, and an absorption edge $\lambda_0$ on the long wavelength side of an ultraviolet-visible absorption spectrum of the temporary protective film, an absorption edge $\lambda_1$ on the long wavelength side of an ultraviolet-visible absorption spectrum of the polymerization initiator, and an absorption edge $\lambda_2$ on the long wavelength side of an ultraviolet-visible absorption spectrum of the substrate satisfy the relationship represented by Expression (Z).

$$\lambda_0 < \lambda_1 < \lambda_2 \qquad \text{Expression (Z)}$$

Compound X: a compound containing a functional group capable of interacting with a plating catalyst or a precursor thereof and a polymerizable group Composition Y: a composition including a compound containing a functional group capable of interacting with a plating catalyst or a precursor thereof, and a compound containing a polymerizable group

[2] The laminate according to [1], in which the substrate contains an ultraviolet absorber.

[3] The laminate according to [1] or [2], in which the substrate is a resin substrate containing a resin $P_1$ and the resin $P_1$ contains an aromatic group, and the temporary protective film is a film containing a resin $P_2$ and the resin $P_2$ does not contain an aromatic group.

[4] The laminate according to [3], in which the resin $P_1$ contains at least one selected from the group consisting of polyethylene terephthalate and polycarbonate.

[5] The laminate according to [4], in which the resin $P_1$ is polyethylene terephthalate.

[6] A method for producing a substrate with a patterned plated layer, comprising a step of irradiating the plated layer forming layer with light in a patternwise manner from the temporary protective film side in the laminate according to any one of [1] to [5]; a step of removing the temporary protective film on the plated layer forming layer; and a step of removing a region not irradiated with light in the plated layer forming layer to form a patterned plated layer on the substrate.

[7] A method for producing a metal layer-containing laminate, comprising a step of irradiating the plated layer forming layer with light in a patternwise manner from the temporary protective film side in the laminate according to any one of [1] to [5]; a step of removing the temporary protective film on the plated layer forming layer; a step of removing a region not irradiated with light in the plated layer forming layer to form a patterned plated layer on the substrate; and a step of applying a plating catalyst or a precursor thereof to the patterned plated layer and subjecting the patterned plated layer to which the plating catalyst or the precursor thereof is applied to a plating treatment to form a metal layer on the patterned plated layer.

[8] A touch panel sensor comprising a metal layer-containing laminate obtained by the production method according to [7].

[9] A touch panel comprising a metal layer-containing laminate obtained by the production method according to [7].

According to the present invention, it is possible to provide a laminate with which a metal layer-containing laminate with the occurrence of pattern thickening being suppressed can be obtained (hereinafter, also referred to as "having the effect of the present invention"). Further, according to the present invention, it is possible to provide methods for producing a substrate with a patterned plated layer and a metal layer-containing laminate, as well as a touch panel sensor and a touch panel.

DESCRIPTION OF THE PREFERRED EMBODIMENTS

Hereinafter, the present invention will be described in detail.

Descriptions of the constituent features described below are sometimes made based on representative embodiments of the present invention, but the present invention is not limited to such embodiments.

Further, in the present specification, the numerical range expressed by using "to" means a range including numerical values described before and after "to" as a lower limit value and an upper limit value, respectively.

[Laminate]

The laminate according to the first embodiment of the present invention is a laminate comprising a substrate, a plated layer forming layer, and a temporary protective film in this order, in which the plated layer forming layer contains a polymerization initiator and Compound X or Composition Y shown below, and an absorption edge $\lambda_0$ on the long wavelength side of an ultraviolet-visible absorption spectrum of the temporary protective film, an absorption edge $\lambda_1$ on the long wavelength side of an ultraviolet-visible absorption spectrum of the polymerization initiator, and an absorption edge $\lambda_2$ on the long wavelength side of an ultraviolet-visible absorption spectrum of the substrate satisfy the relationship represented by Expression (Z). The unit of each absorption edge is nm.

$$\lambda_0 < \lambda_1 < \lambda_2 \qquad \text{Expression (Z)}$$

Compound X: a compound containing a functional group capable of interacting with a plating catalyst or a precursor thereof and a polymerizable group Composition Y: a composition including a compound containing a functional group capable of interacting with a plating catalyst or a precursor thereof, and a compound containing a polymerizable group One of the characteristic points of the laminate is that the light absorption characteristics of the substrate, the polymerization initiator contained in the plated layer forming layer, and the temporary protective film are controlled. Hereinafter, the characteristic points will be described in detail with reference to the accompanying drawings.

Figure 1:
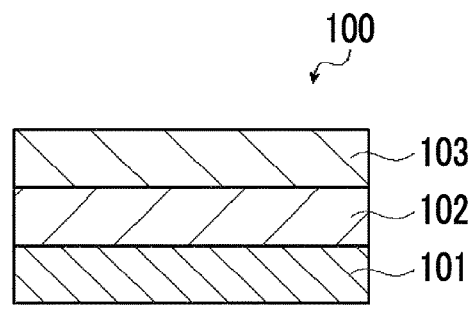
FIG. 1 is a cross-sectional view of a laminate according to a first embodiment of the present invention.

FIG. 1 is a cross-sectional view of the laminate according to the first embodiment. A laminate 100 according to the present embodiment includes a substrate 101, a plated layer forming layer 102, and a temporary protective film 103 in this order.

In the case where a photo mask is disposed on the temporary protective film side of this laminate and light is radiated in a patternwise manner, the photo mask does not come into direct contact with the laminate. Therefore, since the components do not migrate between the photo mask and the laminate and/or the photo mask is not contaminated with the components of the plated layer forming layer, the yield of the substrate with a patterned plated layer is improved.

Figure 2:
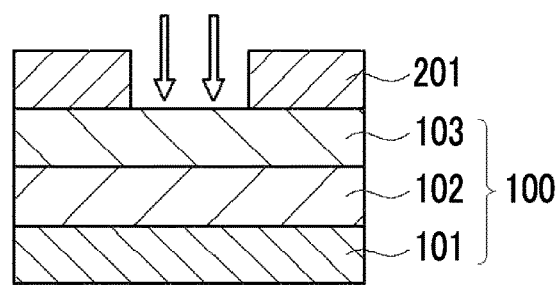
FIG. 2 is a cross-sectional view in the case where a photo mask is disposed on a temporary protective film side of a laminate and light is radiated in a patternwise manner.

FIG. 2 is a cross-sectional view in the case where the photo mask 201 is disposed on the temporary protective film 103 side of the laminate and light is radiated in a patternwise manner. Arrows in the figure schematically show light irradiation.

The light radiated to the temporary protective film 103 is transmitted through the temporary protective film 103, reaches the plated layer forming layer 102, and sensitizes a polymerization initiator (not shown). A part of the light reaching the plated layer forming layer 102 is transmitted through the plated layer forming layer 102 and reaches the substrate 101.

The temporary protective film 103 is disposed between the photo mask 201 and the plated layer forming layer 102 (the temporary protective film 103 is disposed on the plated layer forming layer 102), whereby the light radiated through the photo mask 201 is scattered by the thickness of the temporary protective film 103. In the case where this light reaches the substrate 101, it is assumed that the light is scattered at the interface of the substrate 101 and is incident on the plated layer forming layer 102 again. As a result, it is presumed that the photosensitive region of the plated layer forming layer 102 spreads beyond a desired pattern shape. As the photosensitive region spreads, wiring thickening occurs in the resulting metal layer-containing laminate.

Here, the absorption edge $\lambda_0$ on the long wavelength side of the ultraviolet-visible absorption spectrum of the temporary protective film according to the present embodiment and the absorption edge $\lambda_1$ on the long wavelength side of the ultraviolet-visible absorption spectrum of the polymerization initiator contained in the plated layer forming layer, and the absorption edge $\lambda_2$ on the long wavelength side of the ultraviolet-visible absorption spectrum of the substrate satisfy the relationship represented by Expression (Z). The relationship between $\lambda_0$, $\lambda_1$, and $\lambda_2$ is shown in FIG. 3.

$$\lambda_0 < \lambda_1 < \lambda_2 \qquad \text{Expression (Z)}$$

Figure 3:
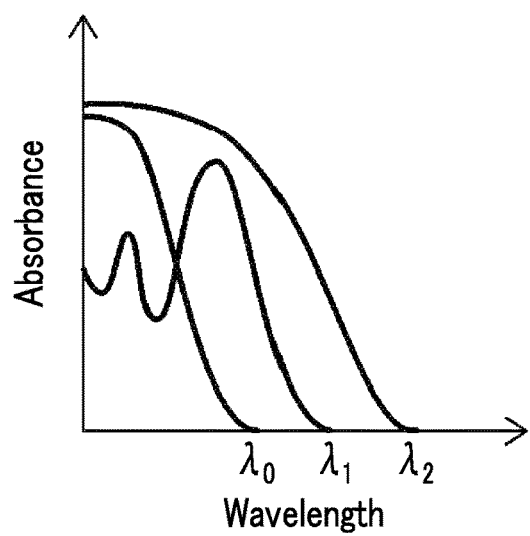
FIG. 3 is a view showing a relationship between ultraviolet-visible absorption spectra of a temporary protective film, a polymerization initiator, and a substrate.

As shown in FIG. 3, in the case where the relationship of $\lambda_0 < \lambda_1$ is satisfied, the polymerization initiator can be sensitized with light in a wavelength range that is not absorbed by the temporary protective film. Further, in the case where the relationship of $\lambda_1 < \lambda_2$ is satisfied, the light transmitted through the plated layer forming layer is absorbed by the substrate. Thus, even in the case where the light scattered by the thickness of the temporary protective film reaches the substrate, it is presumed that the scattered light is absorbed by the substrate and restrained from being incident on the plated layer forming layer again.

As a result, it is presumed that a laminate having the effect of the present invention could be obtained.

[Substrate]

The substrate is not particularly limited as long as the absorption edge $\lambda_2$ on the long wavelength side of the ultraviolet-visible absorption spectrum of the substrate satisfies the relationship represented by Expression (Z). Among them, an insulating substrate is preferable, and more specifically, a substrate made of a resin (hereinafter, also referred to as "resin substrate"), a ceramic substrate, a glass substrate, or the like can be used, and a resin substrate is more preferable. Incidentally, the resin substrate also includes the following pressure-sensitive adhesive sheet.

The material for the resin substrate is not particularly limited, but from the viewpoint that the absorption edge $\lambda_2$ on the long wavelength side of the ultraviolet-visible absorption spectrum of the substrate easily satisfies the relationship represented by Expression (Z), it is preferable to include the resin $P_1$ containing an aromatic group. The phrase "containing an aromatic group" is intended to mean that the structural unit of the resin $P_1$ contains an aromatic group. The aromatic group is not particularly limited, and specific examples thereof include a substituted or unsubstituted benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. The resins as the material for the resin substrate may be used alone or in combination of two or more thereof, but in the case where two or more resins are used in combination, at least the resin having the highest content is preferably the resin $P_1$.

Examples of the material for the resin substrate include a polyester-based resin (polyethylene terephthalate or polyethylene naphthalate), a polyethersulfone-based resin, a polyacrylic resin, a polyurethane-based resin, a polycarbonate-based resin, a polysulfone-based resin, a polyamide-based resin, a polyarylate-based resin, a polyolefin-based resin, a cellulose-based resin, a polyvinyl chloride-based resin, and a cycloolefin-based resin. Among them, polyethylene terephthalate, polyethylene naphthalate, polyolefin, or polycarbonate is preferable, and from the viewpoint of high light transmittance and excellent mechanical properties, it is preferable to include at least one selected from the group consisting of polyethylene terephthalate and polycarbonate; polyethylene terephthalate (hereinafter, also simply referred to as "PET") or polycarbonate is more preferable; and polyethylene terephthalate is still more preferable.

Further, a pressure-sensitive adhesive substrate, that is, a pressure-sensitive adhesive sheet may be used as the substrate. A known material (an acrylic pressure-sensitive adhesive, a silicone-based pressure-sensitive adhesive, or the like) may be used as the material constituting the pressure-sensitive adhesive sheet.

The thickness (mm) of the substrate is not particularly limited. From the viewpoint of the balance of handleability and being made into a thin thickness, the thickness of the resin substrate is preferably 0.01 to 2 mm, more preferably 0.02 to 1 mm, and still more preferably 0.03 to 0.1 mm. Further, the thickness of the glass substrate is preferably 0.01 to 2 mm, more preferably 0.3 to 0.8 mm, and still more preferably 0.4 to 0.7 mm.

Further, it is preferred that the substrate properly transmits light. Specifically, the total light transmittance of the substrate is preferably 85% to 100%.

The absorption edge $\lambda_2$ on the long wavelength side of the ultraviolet-visible absorption spectrum of the substrate is not particularly limited as long as it satisfies the relationship represented by Expression (Z), but it is preferably 400 nm or less, more preferably 380 nm or less, and still more preferably 320 nm or less, from the viewpoint of excellent transparency and visibility of a substrate with a patterned plated layer which will be formed. The lower limit thereof is not particularly limited, but it is 250 nm or more in many cases from the viewpoint of material properties.

The position of the absorption edge of the ultraviolet-visible absorption spectrum of the substrate typically depends on the material of the substrate.

Further, the absorption edge $\lambda_2$ on the long wavelength side of the ultraviolet-visible absorption spectrum of the substrate is intended to refer to a wavelength of the longest wavelength side at which the absorbance becomes 1.0 or less in the case where the ultraviolet-visible absorption spectrum of the substrate is measured by UV-3000 (Shimadzu Corporation).

<Ultraviolet Absorber>

The substrate may contain an ultraviolet absorber. By including the ultraviolet absorber in the substrate, the absorption edge $\lambda_2$ of the ultraviolet-visible absorption spectrum of the substrate is shifted to the longer wavelength side and is therefore likely to satisfy the relationship represented by Expression (Z). In particular, in the case where the substrate and the following temporary protective film are made of the same material, it is preferred that the substrate contains an ultraviolet absorber. Specifically, in the case where the temporary protective film is made of PET, the substrate is preferably made of PET containing an ultraviolet absorber.

Further, as the ultraviolet absorber, it is preferred to select an ultraviolet absorber having an absorption edge on the long wavelength side than the absorption edge $\lambda_1$ on the long wavelength side of the ultraviolet-visible absorption spectrum of a polymerization initiator. That is, the absorption edge on the long wavelength side of the ultraviolet-visible absorption spectrum of the ultraviolet absorber to be used is preferably on the long wavelength side than the absorption edge $\lambda_1$ on the long wavelength side of the ultraviolet-visible absorption spectrum of the polymerization initiator.

Further, the method of measuring the absorption edge of the ultraviolet-visible absorption spectrum of the substrate in the case of using an ultraviolet absorber may also be similar to the above-mentioned procedure.

The type of the ultraviolet absorber to be used is not particularly limited. Known ultraviolet absorbers may be used, and examples thereof include a salicylic acid-based ultraviolet absorber, a benzophenone-based ultraviolet absorber, a benzotriazole-based ultraviolet absorber, a cyanoacrylate-based ultraviolet absorber, a benzoate-based ultraviolet absorber, a malonate-based ultraviolet absorber, and an oxalic acid anilide-based ultraviolet absorber.

Examples of the salicylic acid-based ultraviolet absorber include phenyl salicylate, p-tert-butylphenyl salicylate, and p-octylphenyl salicylate.

Examples of the benzophenone-based ultraviolet absorber include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and bis(2-methoxy-4-hydroxy-5-benzoylphenyl)methane.

Examples of the benzotriazole-based ultraviolet absorber include 2-(2H-benzotriazol-2-yl)-4-(1,1,3,3-tetramethylbutyl)phenol, 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5'-methylphenyl)-5-chlorobenzotriazole, 2-(2'-hydroxy-3',5'-di-tert-butyl-phenyl)-5-chloro-benzotriazole, 2-(2'-hydroxy-3',5'-di-tert-butyl-5'-amylphenyl)benzotriazole, and 2-(2'-hydroxy-4'-octoxyphenyl)benzotriazole.

Examples of the cyanoacrylate-based ultraviolet absorber include 2-ethylhexyl-2-cyano-3,3'-diphenyl acrylate, and ethyl-2-cyano-3,3'-diphenyl acrylate.

The content of the ultraviolet absorber is not particularly limited, but it is preferably 0.01 to 20 parts by mass and more preferably 0.1 to 10 parts by mass with respect to 100 parts by mass of the total mass of the substrate. In the case where the content of the ultraviolet absorber is within the above-specified range, the substrate has superior ultraviolet absorptivity and the ultraviolet absorber is less likely to deposit on the substrate surface.

The substrate may have a single layer structure or a multilayer structure.

In the case where the substrate has a multilayer structure, the substrate may be, for example, a laminate including a support and an ultraviolet absorbing layer containing an ultraviolet absorber disposed on the support.

The support may or may not contain an ultraviolet absorber. Examples of the type of the support include those exemplified as the substrate described above.

The ultraviolet absorbing layer contains at least an ultraviolet absorber. Examples of the ultraviolet absorber include those described above. Further, the ultraviolet absorber may contain a binder such as a resin.

[Plated Layer Forming Layer]

The plated layer forming layer is a layer which becomes a plated layer by light irradiation to be described hereinafter, and contains at least a polymerization initiator and the following compound X or composition Y. More specifically, the plated layer forming layer may be a layer containing a polymerization initiator and compound X, or a layer containing a polymerization initiator and composition Y.

Compound X: a compound containing a functional group capable of interacting with a plating catalyst or a precursor thereof (hereinafter, simply referred to also as an "interactive group"), and a polymerizable group.

Composition Y: a composition including a compound containing a functional group capable of interacting with a plating catalyst or a precursor thereof, and a compound containing a polymerizable group.

Hereinafter, first, materials contained in the plated layer forming layer will be described in detail.

<Polymerization Initiator>

The polymerization initiator is not particularly limited, as long as the absorption edge $\lambda_1$ on the long wavelength side of the ultraviolet-visible absorption spectrum of the polymerization initiator satisfies the relationship represented by Expression (Z), and a known polymerization initiator (so-called photopolymerization initiator) or the like may be used. Examples of the polymerization initiator include benzophenones, acetophenones, α-aminoalkylphenones, benzoins, ketones, thioxanthones, benzyls, benzyl ketals, oxime esters, anthrones, tetramethylthiuram monosulfides, bisacyl phosphine oxides, acyl phosphine oxides, anthraquinones, azo compounds, and derivatives thereof. The polymerization initiators may be used alone or in combination of two or more thereof.

The absorption edge $\lambda_1$ of the ultraviolet-visible absorption spectrum of the polymerization initiator is intended to refer to a wavelength of the longest wavelength side at which an absorbance becomes 1.0 or less in the case where a solution having a polymerization initiator concentration of 0.01% by mass (using a solvent in which a polymerization initiator is dissolved, for example, acetonitrile, as a solvent) is prepared and the absorbance is measured by the above-mentioned UV-3000.

In the first embodiment, it may be sufficient that the absorption edge $\lambda_1$ on the long wavelength side of the ultraviolet-visible absorption spectrum of the polymerization initiator satisfies Expression (Z) in relation to the absorption edge $\lambda_2$ on the long wavelength side of the ultraviolet-visible absorption spectrum of the substrate and the absorption edge $\lambda_0$ on the long wavelength side of the ultraviolet-visible absorption spectrum of the temporary protective film to be described hereinafter.

$$\lambda_0 < \lambda_1 < \lambda_2 \qquad \text{Expression (Z)}$$

The difference between $\lambda_2$ and $\lambda_1$ is preferably 4 nm or more, more preferably 5 nm or more, and still more preferably 10 nm or more, from the viewpoint of easy absorption of light by the substrate. The upper limit thereof is not particularly limited, but it is about 150 nm in many cases.

Here, in the case where two or more polymerization initiators are used in combination, the absorption edge on the long wavelength side of the ultraviolet-visible absorption spectrum of the polymerization initiator having the absorption edge on the long wavelength side of the ultraviolet-visible absorption spectrum on the longer wavelength side is taken as $\lambda_1$.

The content of the polymerization initiator in the plated layer forming layer is not particularly limited, but it is preferably 0.01 to 5% by mass and more preferably 0.1 to 3% by mass with respect to the total mass of the plated layer forming layer, from the viewpoint of curability of a plated layer.

<Compound X>

Compound X is a compound containing an interactive group and a polymerizable group.

The interactive group is intended to refer to a functional group capable of interacting with a plating catalyst or a precursor thereof which is applied to a patterned plated layer. For example, a functional group capable of forming an electrostatic interaction with a plating catalyst or a precursor thereof, or a nitrogen-, sulfur- or oxygen-containing functional group capable of coordinating with a plating catalyst or a precursor thereof may be used.

More specific examples of the interactive group include nitrogen-containing functional groups such as an amino group, an amide group, an imido group, a urea group, a tertiary amino group, an ammonium group, an amidino group, a triazine ring, a triazole ring, a benzotriazole group, an imidazole group, a benzimidazole group, a quinoline group, a pyridine group, a pyrimidine group, a pyrazine group, a nazoline group, a quinoxaline group, a purine group, a triazine group, a piperidine group, a piperazine group, a pyrrolidine group, a pyrazole group, an aniline group, a group containing an alkylamine structure, a group containing an isocyanuric structure, a nitro group, a nitroso group, an azo group, a diazo group, an azide group, a cyano group, and a cyanate group; oxygen-containing functional groups such as an ether group, a hydroxyl group, a phenolic hydroxyl group, a carboxylic acid group, a carbonate group, a carbonyl group, an ester group, a group containing an N-oxide structure, a group containing an S-oxide structure, and a group containing an N-hydroxy structure; sulfur-containing functional groups such as a thiophene group, a thiol group, a thiourea group, a thiocyanurate group, a benzothiazole group, a mercaptotriazine group, a thioether group, a thioxy group, a sulfoxide group, a sulfite group, a group containing a sulfoximine structure, a group containing a sulfoxinium salt structure, a sulfonate group, and a group containing a sulfonic ester structure; phosphorus-containing functional groups such as a phosphate group, a phosphoramide group, a phosphine group, and a group containing a phosphoric ester structure; and groups containing halogen atoms such as a chlorine atom and a bromine atom. In a functional group that may have a salt structure, a salt thereof may also be used.

Among them, preferred is an ionic polar group such as a carboxylic acid group, a sulfonate group, a phosphate group or a boronate group, an ether group, or a cyano group, and more preferred is a carboxylic acid group or a cyano group, from the viewpoint of high polarity and high adsorptive capacity to a plating catalyst or a precursor thereof.

Compound X may contain two or more types of interactive groups.

Compound X may be a low molecular weight compound or a high molecular weight compound. The low molecular weight compound is intended to refer to a compound having a molecular weight of less than 1,000, and the high molecular weight compound is intended to refer to a compound having a molecular weight of 1,000 or more.

Further, the low molecular weight compound containing a polymerizable group corresponds to a so-called monomer. Further, the high molecular weight compound may be a polymer containing a predetermined repeating unit.

Further, the compounds may be used alone or in combination of two or more thereof.

In the case where Compound X is a polymer, the weight-average molecular weight of the polymer is not particularly limited and is preferably 1,000 or more and 700,000 or less and more preferably 2,000 or more and 200,000 or less, from the viewpoint of high solubility and superior handleability. In particular, the weight-average molecular weight is more preferably 20,000 or more from the viewpoint of polymerization sensitivity.

The method of synthesizing such a polymer containing a polymerizable group and an interactive group is not particularly limited and a known synthesis method (see paragraphs [0097] to [0125] of JP2009-280905A) is used.

(First Preferred Aspect of Polymer)

A first preferred aspect of the polymer may be, for example, a copolymer containing a polymerizable group-containing repeating unit represented by Formula (a) (hereinafter, also referred to as a "polymerizable group unit" where appropriate) and an interactive group-containing repeating unit represented by Formula (b) (hereinafter, also referred to as an "interactive group unit" where appropriate).

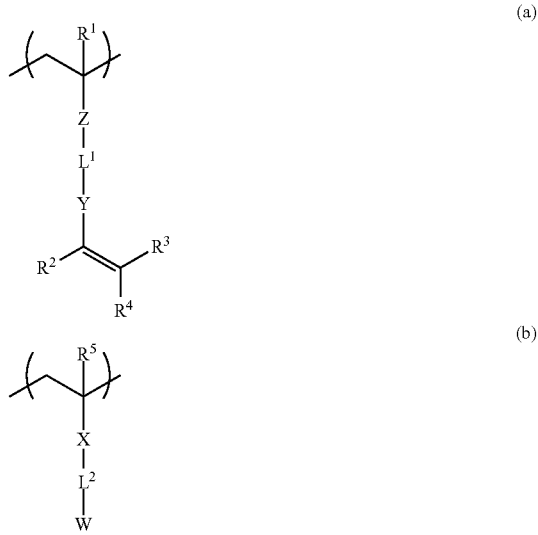

In Formulae (a) and (b), $R^1$ to $R^5$ each independently represent a hydrogen atom, or a substituted or unsubstituted alkyl group (for example, a methyl group, an ethyl group, a propyl group, or a butyl group). Further, the type of the substituent is not particularly limited, and examples thereof include a methoxy group, a chlorine atom, a bromine atom, and a fluorine atom.

$R^1$ is preferably a hydrogen atom, a methyl group, or a methyl group substituted with a bromine atom. $R^2$ is preferably a hydrogen atom, a methyl group, or a methyl group substituted with a bromine atom. $R^3$ is preferably a hydrogen atom. $R^4$ is preferably a hydrogen atom. $R^5$ is preferably a hydrogen atom, a methyl group, or a methyl group substituted with a bromine atom.

In Formulae (a) and (b), X, Y, and Z each independently represent a single bond, or a substituted or unsubstituted divalent organic group. Examples of the divalent organic group include a substituted or unsubstituted divalent aliphatic hydrocarbon group (which preferably has 1 to 8 carbon atoms. For example, an alkylene group such as a methylene group, an ethylene group, or a propylene group), a substituted or unsubstituted divalent aromatic hydrocarbon group (which preferably has 6 to 12 carbon atoms. For example, a phenylene group), —O—, —S—, —$SO_2$—, —N(R)— (R: alkyl group), —CO—, —NH—, —COO—, —CONH—, and a group formed by combining these groups (for example, an alkyleneoxy group or an alkylenecarbonyloxy group).

X, Y, and Z are each preferably a single bond, an ester group (—COO—), an amide group (—CONH—), an ether group (—O—), or a substituted or unsubstituted divalent aromatic hydrocarbon group and more preferably a single bond, an ester group (—COO—), or an amide group (—CONH—), from the viewpoint of easy polymer synthesis and superior adhesiveness of a metal layer which will be described hereinafter.

In Formulae (a) and (b), $L^1$ and $L^2$ each independently represent a single bond, or a substituted or unsubstituted divalent organic group. The divalent organic group has the same definition as in the divalent organic group described for X, Y, and Z above.

$L^1$ is preferably an aliphatic hydrocarbon group or a divalent organic group (for example, an aliphatic hydrocarbon group) containing a urethane bond or a urea bond from the viewpoint of easy polymer synthesis and superior adhesiveness of a metal layer. Among them, preferred are groups having a total number of carbon atoms of 1 to 9. The total number of carbon atoms in $L^1$ refers to the total number of carbon atoms contained in the substituted or unsubstituted divalent organic group represented by $L^1$.

Further, $L^2$ is preferably a single bond, a divalent aliphatic hydrocarbon group, a divalent aromatic hydrocarbon group, or a group formed by combining these groups, from the viewpoint of superior adhesiveness of a metal layer. Among them, $L^2$ is more preferably a single bond or has a total number of carbon atoms of 1 to 15. The divalent organic group represented by $L^2$ is preferably unsubstituted. Here, the total number of carbon atoms in $L^2$ refers to a total number of carbon atoms contained in the substituted or unsubstituted divalent organic group represented by $L^2$.

In Formula (b), W represents an interactive group. The definition of the interactive group is as described above.

The content of the polymerizable group unit is preferably 5 to 50 mol % and more preferably 5 to 40 mol % with respect to the total repeating units in the polymer, from the viewpoint of reactivity (curability and/or polymerizability) and inhibition of gelation during synthesis.

Further, the content of the interactive group unit is preferably 5 to 95 mol % and more preferably 10 to 95 mol % with respect to the total repeating units in the polymer, from the viewpoint of absorptivity to a plating catalyst or a precursor thereof.

(Second Preferred Aspect of Polymer)

The second preferred aspect of the polymer may be, for example, a copolymer containing repeating units represented by Formula (A), Formula (B), and Formula (C).

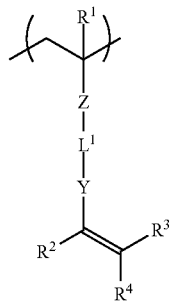

(A)

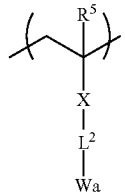

(B)

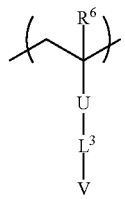

(C)

The repeating unit represented by Formula (A) is the same as the repeating unit represented by Formula (a), and the same also applies to the description of each group.

$R^5$, X, and $L^2$ in the repeating unit represented by Formula (B) are the same as $R^5$, X and $L^2$ in the repeating unit represented by Formula (b), and the same also applies to the description of each group.

Wa in Formula (B) represents a group capable of interacting with a plating catalyst or a precursor thereof, excluding a hydrophilic group or a precursor group thereof represented by V to be described hereinafter. Among them, preferred is a cyano group or an ether group.

In Formula (C), $R^6$'s each independently represent a hydrogen atom or a substituted or unsubstituted alkyl group.

In Formula (C), U represents a single bond or a substituted or unsubstituted divalent organic group. The definition of the divalent organic group is the same as that of the above-mentioned divalent organic group represented by X, Y, and Z. U is preferably a single bond, an ester group (—COO—), an amide group (—CONH—), an ether group (—O—), or a substituted or unsubstituted divalent aromatic hydrocarbon group, from the viewpoint of easy polymer synthesis and superior adhesiveness of a metal layer.

In Formula (C), $L^3$ represents a single bond or a substituted or unsubstituted divalent organic group. The definition of the divalent organic group is the same as that of the above-mentioned divalent organic group represented by $L^1$ and $L^2$. $L^3$ is preferably a single bond, or a divalent aliphatic hydrocarbon group, a divalent aromatic hydrocarbon group, or a group formed by combining these groups, from the viewpoint of easy polymer synthesis and superior adhesiveness of a metal layer.

In Formula (C), V represents a hydrophilic group or a precursor group thereof. The hydrophilic group is not particularly limited as long as it is a group exhibiting hydrophilicity, and examples thereof include a hydroxyl group and a carboxylic acid group. The precursor group of the hydrophilic group refers to a group capable of generating a hydrophilic group by a predetermined treatment (for example, treatment with an acid or alkali), and examples thereof include a carboxylic acid group protected with a 2-tetrahydropyranyl (THP) group.

The hydrophilic group is preferably an ionic polar group from the viewpoint of interaction with a plating catalyst or a precursor thereof. Specific examples of the ionic polar group include a carboxylic acid group, a sulfonate group, a phosphate group, and a boronate group. Among them, preferred is a carboxylic acid group from the viewpoint of moderate acidity (not degrading other functional groups).

The preferred content of each unit in the second preferred aspect of the polymer is as follows.

The content of the repeating unit represented by Formula (A) is preferably 5 to 50 mol % and more preferably 5 to 30 mol % with respect to the total repeating units in the polymer, from the viewpoint of reactivity (curability and/or polymerizability) and inhibition of gelation during synthesis.

The content of the repeating unit represented by Formula (B) is preferably 5 to 75 mol % and more preferably 10 to 70 mol % with respect to the total repeating units in the polymer, from the viewpoint of absorptivity to a plating catalyst or a precursor thereof.

The content of the repeating unit represented by Formula (C) is preferably 10 to 70 mol %, more preferably 20 to 60 mol %, and still more preferably 30 to 50 mol % with respect to the total repeating units in the polymer, from the viewpoint of developability with an aqueous solution and humidity-resistant adhesiveness.

Specific examples of the above-mentioned polymer include polymers described in paragraphs [0106] to [0112] of JP2009-007540A, polymers described in paragraphs [0065] to [0070] of JP2006-135271A, and polymers described in paragraphs [0030] to [0108] of US2010-080964A.

These polymers can be produced by known methods (for example, methods in the literature listed above).

(Preferred Aspect of Monomer)

In the case where the compound is a so-called monomer, a compound represented by Formula (X) can be mentioned as one preferred aspect of the monomer.

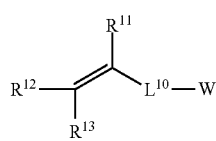

Formula (X)

In Formula (X), $R^{11}$ to $R^{13}$ each independently represent a hydrogen atom or a substituted or unsubstituted alkyl group. Examples of the unsubstituted alkyl group include a methyl group, an ethyl group, a propyl group, and a butyl group. Examples of the substituted alkyl group include a methyl group, an ethyl group, a propyl group, and a butyl group each of which is substituted with a methoxy group, a chlorine atom, a bromine atom, a fluorine atom, or the like. $R^{11}$ is preferably a hydrogen atom or a methyl group. $R^{12}$ is preferably a hydrogen atom. $R^{13}$ is preferably a hydrogen atom.

$L^{10}$ represents a single bond or a divalent organic group. Examples of the divalent organic group include a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —SO$_2$—, —N(R)— (R: alkyl group), —CO—, —NH—, —COO—, —CONH—, or a group formed by combining these groups (for example, an alkyleneoxy group or an alkylenecarbonyloxy group).

The substituted or unsubstituted aliphatic hydrocarbon group is preferably a methylene group, an ethylene group, a propylene group or a butylene group, or such a group substituted with a methoxy group, a chlorine atom, a bromine atom, a fluorine atom, or the like.

The substituted or unsubstituted aromatic hydrocarbon group is preferably an unsubstituted phenylene group, or a phenylene group substituted with a methoxy group, a chlorine atom, a bromine atom, a fluorine atom, or the like.

In Formula (X), one suitable aspect of $L^{10}$ may be, for example, a —NH— aliphatic hydrocarbon group- or a —CO— aliphatic hydrocarbon group-.

W has the same definition as W in Formula (b) and represents an interactive group. The definition of the interactive group is as described above.

In Formula (X), a suitable aspect of W may be, for example, an ionic polar group and is more preferably a carboxylic acid group.

<Composition Y>

The Composition Y is a composition including a compound containing an interactive group and a compound containing a polymerizable group. That is, the plated layer forming layer contains two compounds: a compound containing an interactive group and a compound containing a polymerizable group. The definition of the interactive group and the polymerizable group is as described above.

The compound containing an interactive group may be a low molecular weight compound or a high molecular weight compound. A suitable aspect of the compound containing an interactive group may be, for example, a polymer containing a repeating unit represented by Formula (b) (for example, polyacrylic acid). Further, a polymerizable group is not contained in the compound containing an interactive group.

The compound containing a polymerizable group is a so-called monomer, and is preferably a polyfunctional monomer containing two or more polymerizable groups from the viewpoint of superior hardness of a plated layer to be formed. With regard to the polyfunctional monomer, specifically, it is preferred to use a monomer containing 2 to 6 polymerizable groups. From the viewpoint of mobility of molecules during the crosslinking reaction which affects the reactivity, the molecular weight of the polyfunctional monomer to be used is preferably 150 to 1,000 and more preferably 200 to 700. Further, the interval (distance) between a plurality of polymerizable groups is preferably 1 to 15 atoms and more preferably 6 to 10 atoms.

The compound containing a polymerizable group may contain an interactive group.

One suitable form of the compound containing a polymerizable group may be, for example, a compound represented by Formula (1).

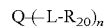

Formula (1)

In Formula (1), $R_{20}$ represents a polymerizable group.

L represents a single bond or a divalent organic group. The definition of the divalent organic group is as described above.

Q represents an n-valent organic group. Preferred examples of the n-valent organic group include a group represented by the following Formula (1A), a group represented by the following Formula (1B),

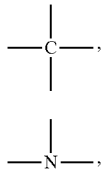

—NH—, —NR (R: alkyl group)-, —O—, —S—, a carbonyl group, an alkylene group, an alkenylene group, an alkynylene group, a cycloalkylene group, an aromatic group, a heterocyclic group, and an n-valent organic group formed by combining two or more such groups.

n represents an integer of 2 or more and preferably 2 to 6.

The mass ratio of the compound containing an interactive group:the compound containing a polymerizable group (mass of the compound containing an interactive group/mass of the compound containing a polymerizable group) is not particularly limited, but it is preferably 0.1 to 10 and more preferably 0.5 to 5 from the viewpoint of balance of strength and plating suitability of a plated layer to be formed.

The content of Compound X (or Composition Y) in the plated layer forming layer is not particularly limited, but it is preferably 50% by mass or more and more preferably 80% by mass or more with respect to the total mass of the plated layer forming layer. The upper limit thereof is not particularly limited, but it is preferably 99.5% by mass or less.

The plated layer forming layer may contain components other than the above-mentioned polymerization initiator, Compound X, and Composition Y.

For example, the plated layer forming layer may contain a monomer (excluding the compound represented by Formula (X)). The inclusion of a monomer can result in appropriate control of a crosslinking density or the like in the plated layer.

The monomer to be used is not particularly limited. For example, there are a compound containing an ethylenically unsaturated bond as a compound containing addition polymerizability, and a compound containing an epoxy group as a compound containing a ring-opening polymerizability. Among them, from the viewpoint of improving a crosslinking density in the plated layer, it is preferred to use a polyfunctional monomer. The polyfunctional monomer refers to a monomer containing two or more polymerizable groups. Specifically, it is preferred to use a monomer containing 2 to 6 polymerizable groups.

If necessary, other additives (for example, a sensitizer, a curing agent, a polymerization inhibitor, an antioxidant, an antistatic agent, a filler, particles, a flame retardant, a surfactant, a lubricant, and a plasticizer) may be added to the plated layer forming layer.

[Temporary Protective Film]

The temporary protective film is disposed on the plated layer forming layer. The temporary protective film is a member having a function of protecting the plated layer forming layer so that the photo mask used for irradiating the laminate with light in a patternwise manner does not come into direct contact with the plated layer forming layer.

The temporary protective film is particularly useful in the case of carrying out so-called contact exposure in which a photo mask is directly brought into close contact with a plated layer forming layer and irradiated with light, and therefore the yield of a substrate with a patterned plated layer produced using a laminate can be improved. It should be noted that the temporary protective film disposed on the plated layer forming layer is removed from the laminate after being irradiated with light.

The temporary protective film is not particularly limited as long as the absorption edge $\lambda_0$ on the long wavelength side of the ultraviolet-visible absorption spectrum of the temporary protective film satisfies the relationship represented by Expression (Z). For example, an insulating temporary protective film is preferable, and more specifically, a temporary protective film made of a resin (hereinafter, also referred to as "resin temporary protective film"), a temporary protective film made of ceramic, a temporary protective film made of glass, or the like can be used, among which a resin temporary protective film is preferable. Incidentally, the resin temporary protective film also includes the following pressure-sensitive adhesive sheet.

The material for the temporary protective film made of a resin is not particularly limited, but it is preferable to include a resin $P_2$ containing no aromatic group from the viewpoint that the absorption edge $\lambda_0$ on the long wavelength side of the ultraviolet-visible absorption spectrum of the temporary protective film easily satisfies the relationship represented by Expression (Z). Specifically, the resin $P_2$ containing no aromatic group is preferably a resin having a light transmittance of 50% or more at a wavelength of 250 nm. Specific examples of the resin $P_2$ include a polyolefin-based resin and a cycloolefin-based resin.

Examples of the material for the temporary protective film made of a resin include a polyester-based resin (polyethylene terephthalate or polyethylene naphthalate), a polyethersulfone-based resin, a polyacrylic resin, a polyurethane-based resin, a polycarbonate-based resin, a polysulfone-based resin, a polyamide-based resin, a polyarylate-based resin, a polyolefin-based resin, a cellulose-based resin, a polyvinyl chloride-based resin, and a cycloolefin-based resin, among which a polyester-based resin, a polyacrylic resin, a cellulose-based resin, or a cycloolefin-based resin is preferable and a cycloolefin-based resin is more preferable.

The thickness of the temporary protective film is not particularly limited, but from the viewpoint of superior handleability and easiness of laminating with the plated layer forming layer, the resin temporary protective film has a thickness of preferably 1 to 300 μm, more preferably 2 to 200 μm, still more preferably 2 to 100 μm, and particularly preferably 3 to 50 μm.

Further, it is preferred that the temporary protective film properly transmits light. Specifically, the total light transmittance of the temporary protective film is preferably 85% to 100%.

The absorption edge $\lambda_0$ on the long wavelength side of the ultraviolet-visible absorption spectrum of the temporary protective film is not particularly limited as long as it satisfies the relationship represented by Expression (Z), but it is preferably 400 nm or less, more preferably 350 nm or less, and still more preferably 300 nm or less, from the viewpoint of excellent transparency and visibility of a substrate with a patterned plated layer which will be formed. The lower limit thereof is not particularly limited, but it is 200 nm or more in many cases from the viewpoint of material properties.

The position of the absorption edge $\lambda_0$ of the ultraviolet-visible absorption spectrum of the temporary protective film typically depends on the material of the temporary protective film.

Further, the absorption edge $\lambda_0$ on the long wavelength side of the ultraviolet-visible absorption spectrum of the temporary protective film is intended to refer to a wavelength of the longest wavelength side at which the absorbance becomes 1.0 or less in the case where the ultraviolet-visible absorption spectrum of the temporary protective film is measured by UV-3000 (Shimadzu Corporation).

The temporary protective film may have a single layer structure or a multilayer structure. In the case where the temporary protective film has a multilayer structure, the member constituting the temporary protective film is not particularly limited. For example, the temporary protective film may include a layer for facilitating peeling from the plated layer forming layer (for example, it can be formed by applying a release agent to a film made of the above-mentioned resin).

[Method for Producing Laminate]

The method for producing a laminate including a substrate, a plated layer forming layer, and a temporary protective film in this order is not particularly limited, and examples thereof include a method of applying a composition containing the above-mentioned components onto a substrate to form a plated layer forming layer (coating method), and laminating a temporary protective film thereon to form a laminate, and a method of forming a plated layer forming layer on a temporary substrate different from a substrate and transferring it on the substrate (transfer method), and laminating a temporary protective film thereon to form a laminate. Among them, a coating method is preferable from the viewpoint that the thickness of the plated layer forming layer can be easily controlled.

Hereinafter, aspects of the coating method will be described in detail.

The composition used in the coating method contains at least a polymerization initiator and Compound X or Composition Y. The composition may contain other components, if necessary.

Further, the composition preferably contains a solvent, from the viewpoint of handleability.

The solvent that can be used is not particularly limited, and examples thereof include water; an alcohol-based solvent such as methanol, ethanol, propanol, ethylene glycol, 1-methoxy-2-propanol, glycerin, or propylene glycol monomethyl ether; an acid such as acetic acid; a ketone-based solvent such as acetone, methyl ethyl ketone, or cyclohexanone; an amide-based solvent such as formamide, dimethylacetamide, or N-methylpyrrolidone; a nitrile-based solvent such as acetonitrile or propionitrile; an ester-based solvent such as methyl acetate or ethyl acetate; a carbonate-based solvent such as dimethyl carbonate or diethyl carbonate; in addition to those, an ether-based solvent, a glycol-based solvent, an amine-based solvent, a thiol-based solvent, and a halogen-based solvent.

Among them, an alcohol-based solvent, an amide-based solvent, a ketone-based solvent, a nitrile-based solvent, or a carbonate-based solvent is preferred.

The content of the solvent in the composition is not particularly limited, but it is preferably 50 to 98% by mass and more preferably 70 to 95% by mass with respect to the total amount of the composition. In the case where the content of the solvent is within the above-specified range, handleability of the composition is excellent and control of the thickness is easy.

In the case of using the coating method, a method of applying a composition onto a substrate is not particularly limited and a known method (for example, spin coating, die coating, or dip coating) can be used.

The composition applied onto the substrate may be dried, if necessary, to remove the remaining solvent.

The drying conditions are not particularly limited, but it is preferred that the drying temperature is room temperature to 220° C. (preferably 50° C. to 120° C.) and the drying time is 1 to 30 minutes (preferably 1 to 10 minutes) from the viewpoint of superior productivity.

The thickness of the plated layer forming layer is not particularly limited, but it is preferably 0.01 to 20 μm, more preferably 0.1 to 10 μm, and still more preferably 0.1 to 5 μm.

Further, the laminate may include layers other than a substrate, a plated layer forming layer, and a temporary protective film.

For example, a primer layer may be disposed between the substrate and the plated layer forming layer. The disposition of the primer layer results in improved adhesiveness between a patterned plated layer to be described hereinafter and a substrate.

In order to increase adhesiveness of the patterned plated layer by way of the primer layer, it may employ a variety of means improving adhesion such as control of surface energy, formation of a chemical bond with a patterned plated layer, and use of a pressure-sensitive adhesive force due to stress relaxation. In the case of surface energy control, for example, it is possible to use a low molecular weight layer and/or high molecular weight layer close to the surface energy of the patterned plated layer. In the case of chemical bond formation, it is possible to use a low molecular weight layer and/or high molecular weight layer containing a polymerization active site. In the case of using a pressure-sensitive adhesive force due to stress relaxation, it is possible to use a rubber-like resin or the like having a low modulus of elasticity.

The thickness of the primer layer is not particularly limited. Generally, the thickness of the primer layer is preferably 0.01 to 100 μm, more preferably 0.05 to 20 μm, and still more preferably 0.05 to 10 μm.

The material for the primer layer is not particularly limited, but it is preferably a resin having good adhesiveness with a substrate. A specific example of the resin may be a thermosetting resin, a thermoplastic resin, or a mixture thereof. Examples of the thermosetting resin include an epoxy resin, a phenol resin, a polyimide resin, a polyester resin, a bismaleimide resin, a polyolefin-based resin, and an isocyanate-based resin. Examples of the thermoplastic resin include a phenoxy resin, polyether sulfone, polysulfone, polyphenylene sulfone, polyphenylene sulfide, polyphenyl ether, polyether imide, and an acrylonitrile butadiene styrene (ABS) resin.

The thermoplastic resins and the thermosetting resins may be respectively used alone or in combination of two or more thereof. Further, a resin containing a cyano group may be used. Specifically, an ABS resin, and "polymers containing a unit containing a cyano group on the side chain" described in paragraphs [0039] to [0063] of JP2010-84196A may also be used.

Further, it may also be possible to use a rubber component such as acrylonitrile/butadiene rubber (NBR rubber) or styrene/butadiene rubber (SBR rubber).

One suitable aspect of the material constituting a primer layer may be, for example, a polymer containing a conjugated diene compound unit which may be hydrogenated. The conjugated diene compound unit refers to a repeating unit derived from a conjugated diene compound. The conjugated diene compound is not particularly limited as long as it is a compound containing a molecular structure containing two carbon-carbon double bonds separated by one single bond.

One suitable aspect of the repeating unit derived from a conjugated diene compound may be, for example, a repeating unit generated by a polymerization reaction of a compound containing a butadiene skeleton.

The conjugated diene compound unit may be hydrogenated, and in the case of containing a hydrogenated conjugated diene compound unit, adhesiveness of a patterned metal layer is preferably further improved. That is, the double bond in the repeating unit derived from a conjugated diene compound may be hydrogenated.

The polymer containing a conjugated diene compound unit which may be hydrogenated may also contain the above-described interactive group.

Examples of suitable aspects of this polymer include an acrylonitrile butadiene rubber (NBR), a carboxylic acid group-containing nitrile rubber (XNBR), an acrylonitrile-butadiene-isoprene rubber (NBIR), an acrylonitrile-butadiene-styrene copolymer (ABS resin), and a hydrogenated product thereof (for example, a hydrogenated acrylonitrile butadiene rubber).

The primer layer may also contain other additives (for example, a sensitizer, an antioxidant, an antistatic agent, an ultraviolet absorber, a filler, particles, a flame retardant, a surfactant, a lubricant, and a plasticizer).

The method of forming a primer layer is not particularly limited, and examples thereof include a method in which a resin to be used is laminated on a substrate, and a method in which necessary components are dissolved in a solvent capable of dissolving such components, followed by coating and/or drying on a substrate surface by a method such as coating.

With respect to the heating temperature and time in a coating method, the conditions under which a coating solvent can be sufficiently dried may be selected. From the viewpoint of manufacturing suitability, it is preferred to select the heating conditions in which the heating temperature is 200° C. or lower and the heating time is in the range of within 60 minutes, and it is more preferred to select the heating conditions in which the heating temperature is 40° C. to 100° C. and the heating time is in the range of within 20 minutes. Regarding the solvent to be used, an optimum solvent (for example, cyclohexanone or methyl ethyl ketone) is suitably selected depending on the resin to be used.

In the above description, the laminate including a substrate, a plated layer forming layer, and a temporary protective film in this order has been described. However, the plated layer forming layer may be disposed on both surfaces of the substrate as long as the laminate includes the substrate, the plated layer forming layer, and the temporary protective film in this order. That is, a laminate including the respective members in the order of the temporary protective film, the plated layer forming layer, the substrate, the plated layer forming layer, and the temporary protective film is also encompassed by the present embodiment.

[Method for Producing Substrate with Patterned Plated Layer]

Next, a method for producing a substrate with a patterned plated layer according to a second embodiment of the present invention will be described in detail. The method for producing a substrate with a patterned plated layer includes a step A of producing a laminate including a substrate, a plated layer forming layer, and a temporary protective film in this order, a step B of irradiating the plated layer forming layer with light in a patternwise manner from the temporary protective film side in the laminate, a step C of removing the temporary protective film on the plated layer forming layer, and a step D of removing a region not irradiated with light in the plated layer forming layer to form a patterned plated layer on the substrate.

In addition, FIGS. 4 to 7 are cross-sectional views showing an example of the above embodiment in the order of steps. Each step will be described in detail with reference to the drawings.

[Step A: Step of Producing Laminate (Laminate Production Step)]

Figure 4:
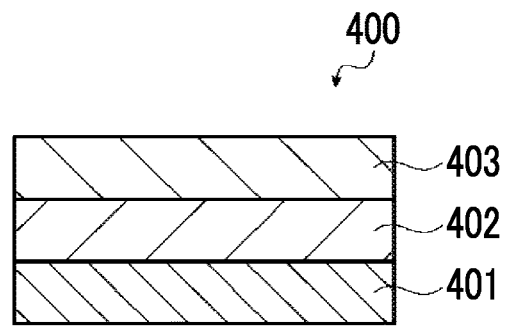
FIG. 4 is a cross-sectional view showing a method for producing a substrate with a patterned plated layer according to a second embodiment of the present invention.

Step A is a step of producing a laminate including a substrate, a plated layer forming layer, and a temporary protective film in this order. More specifically, as shown in FIG. 4, in the present step, a laminate 400 including a substrate 401, a plated layer forming layer 402 disposed on the substrate 401, and a temporary protective film 403 disposed on the plated layer forming layer 402 is produced. The laminate 400 obtained in the present step corresponds to a laminate having the plated layer forming layer 402 to be subjected to light irradiation which will be described below. In addition, the members and materials described as members and materials constituting the laminate of the first embodiment can be appropriately used in the present step. Further, the production method described as the method for producing the laminate of the first embodiment can be appropriately used in the present step.

[Step B: Step of Irradiating Plated Layer Forming Layer with Light in Patternwise Manner from Temporary Protective Film Side in Laminate (Irradiation Step)]

The present step is a step of irradiating the plated layer forming layer 402 with light in a patternwise manner (step of carrying out patternwise exposure) from the temporary protective film 403 side of the laminate 400 produced in the above step. That is, the present step is a step of irradiating the plated layer forming layer 402 in a patternwise manner with light having a wavelength at which a polymerization initiator is sensitized. After the present step, the non-irradiated region (unexposed part) of the plated layer forming layer is removed to form a patterned plated layer. In addition, the light corresponds to light containing a wavelength on the longer wavelength side than the absorption edge $\lambda_0$ on the long wavelength side of the ultraviolet-visible absorption spectrum of the temporary protective film and containing a wavelength at which the polymerization initiator is sensitized.

Figure 5:
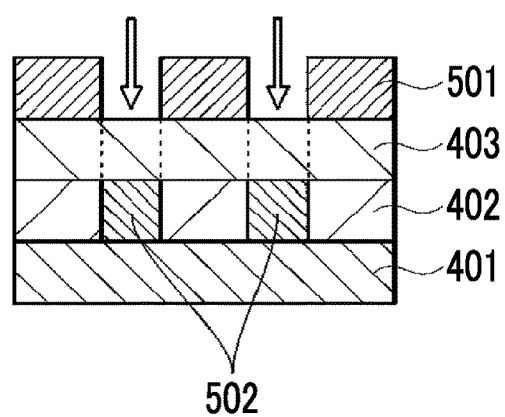
FIG. 5 is a cross-sectional view showing the method for producing a substrate with a patterned plated layer according to the second embodiment of the present invention.

More specifically, first, as shown in FIG. 5, a predetermined irradiation region 502 (a region irradiated with light) of the plated layer forming layer 402 is irradiated through the opening of the photo mask 501 with light containing a wavelength at which the polymerization initiator is sensitized. As described above, in the present embodiment, the absorption edge on the long wavelength side of the ultraviolet-visible absorption spectrum of each member satisfies the relationship represented by Expression (Z). Light radiated in a patternwise manner from the side of the temporary protective film 403 is transmitted through the temporary protective film 403 to sensitize the polymerization initiator contained in the plated layer forming layer 402. Then, a part of the irradiated light is transmitted through the plated layer forming layer 402 and reaches the substrate 401. Since the absorption edge $\lambda_2$ on the long wavelength side of the ultraviolet-visible absorption spectrum of the substrate 401 is on the longer wavelength side than the absorption edge $\lambda_1$ on the long wavelength side of the ultraviolet-visible absorption spectrum of the polymerization initiator, the light transmitted through the plated layer forming layer 402 is absorbed by the substrate 401. Thereby, it is possible to prevent the light transmitted through the plated layer forming layer 402 from being scattered at the interface of the substrate 401 and being incident on the plated layer forming layer 402 again. As a result, it is possible to form a desired irradiated region 502 in the plated layer forming layer 402.

In FIG. 5, an example of contact exposure in which the photo mask 501 is directly brought into contact with the temporary protective film 403 to carry out exposure is described, but the method for producing a substrate with a patterned plated layer according to the present embodiment can also be applied to projection exposure.

The light-irradiated region (irradiated region 502) in the plated layer forming layer 402 undergoes polymerization between the polymerizable groups and/or a reaction between the substrate and the polymerizable group and is then cured to become an insoluble portion. This insoluble portion becomes a so-called plated layer. After the light is radiated, the temporary protective film 403 is removed.

The light radiated to the plated layer forming layer 402 in the present step is light having a wavelength at which the polymerization initiator in the plated layer forming layer 402 is sensitized. More specifically, it is light having a wavelength on the shorter wavelength side than the absorption edge $\lambda_1$ on the long wavelength side of the ultraviolet-visible absorption spectrum of the polymerization initiator. It may be sufficient that the light radiated to the plated layer forming layer 402 in the present step contains light having a wavelength at which the polymerization initiator is sensitized, and such light may contain light having other wavelengths. That is, it may be sufficient that the light radiated to the plated layer forming layer 402 contains light having a wavelength at which the polymerization initiator is sensitized, and such light may contain the light having a wavelength on the longer wavelength side than the absorption edge $\lambda_1$ on the long wavelength side of the ultraviolet-visible absorption spectrum of the polymerization initiator.

The irradiated light may be monochromatic light or continuous light as long as it satisfies the foregoing requirement. In the case where the light satisfying the foregoing requirement is irradiated, there is a method of appropriately selecting a light source, a method of selecting light of a specific wavelength using a light source and a predetermined light shielding filter, or the like.

There is no particular limitation on the method of irradiating the plated layer forming layer 402 with light in a patternwise manner (hereinafter, also referred to as "exposing"). The light source used for irradiating the light is not particularly limited, and may be sufficient as long as it is capable of irradiating light of the above-mentioned wavelength. Examples of the light source include a mercury lamp, a metal halide lamp, a xenon lamp, a chemical lamp, and a carbon arc lamp.

The time for irradiating light (hereinafter, also referred to as "exposure time") varies depending on the reactivity of the polymerization initiator and/or the light source and is usually 10 seconds to 5 hours. The energy of the light to be irradiated (hereinafter, also referred to as "exposure energy") may be about 10 to 8,000 mJ and is preferably in the range of 50 to 3,000 mJ.

The method of irradiating light in a patternwise manner is not particularly limited and a known method may be employed. For example, light may be irradiated to the plated layer forming layer through the opening of the photo mask.

[Step C: Step of Removing Temporary Protective Film on Plated Layer Forming Layer]

The present step is a step of removing the temporary protective film 403 from the plated layer forming layer 402 of the laminate subjected to patternwise exposure in the above step. There is no particular limitation on the method of removing the temporary protective film, and a known method can be used. For example, a method of peeling the laminated temporary protective film 403 can be mentioned.

[Step D: Step of Removing Region not Irradiated with Light in Plated Layer Forming Layer to Form Patterned Plated Layer on Substrate (Removing Step)]

Figure 6:
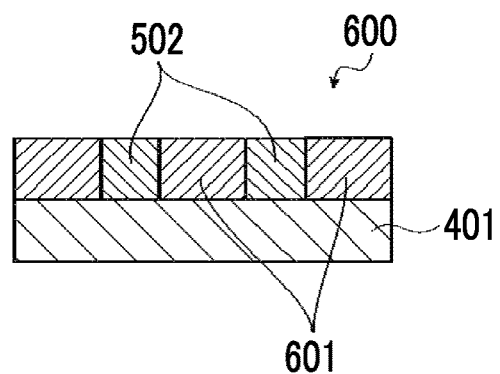
FIG. 6 is a cross-sectional view showing the method for producing a substrate with a patterned plated layer according to the second embodiment of the present invention.
Figure 7:
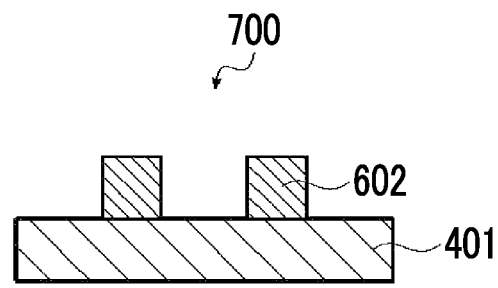
FIG. 7 is a cross-sectional view showing the method for producing a substrate with a patterned plated layer according to the second embodiment of the present invention.

The present step is a step of removing the non-irradiated region 601 (unexposed part) of the plated layer forming layer 402 to which the irradiation step has been applied. By carrying out the present step, the non-irradiated region 601 in the plated layer forming layer 402 is removed and therefore the patterned plated layer 602 is formed. More specifically, as shown in FIGS. 6 and 7, by applying the present step to the laminate 600 which has been irradiated with light and from which the temporary protective film 403 has been removed, the non-irradiated region 601 is removed and therefore a substrate 700 with a patterned plated layer including the patterned plated layer 602 is obtained.

The removal method is not particularly limited, and the optimum method is appropriately selected depending on the compound contained in the plated layer forming layer 402. Usually, there may be mentioned a method in which a solvent in which the compound is dissolved is brought into contact with the plated layer forming layer 402.

More specifically, there may be mentioned a method in which an alkaline solution is used as a developer. In the case where the non-irradiated region 601 is removed using an alkaline solution, there may be mentioned a method in which the laminate 600 which has been subjected to the irradiation step and from which the temporary protective film 403 has been removed is immersed in an alkaline solution (immersion method), or a method in which an alkaline solution is applied onto the plated layer forming layer 402 (coating method). The immersion method is preferred. In the case of the immersion method, the immersion time is preferably about 1 to 30 minutes from the viewpoint of productivity and workability.

By the procedure described above, the substrate 700 with a patterned plated layer including the substrate 401 and the patterned plated layer 602 is obtained.

The substrate 700 with a patterned plated layer can be used for forming a metal film (conductive film). That is, by applying a plating catalyst or a precursor thereof to the patterned plated layer and subjecting it to a plating treatment, it is possible to form a metal layer on the patterned plated layer. That is, by controlling the shape of the patterned plated layer, it is possible to control the pattern of the metal layer. Further, by using such a patterned plated layer, adhesiveness of a metal layer to a substrate is excellent.

In the above description, the method for producing a substrate with a patterned plated layer in which the patterned plated layer is disposed on one surface of the substrate has been described, but the patterned plated layer may be disposed on both surfaces of the substrate. In this case, it can be carried out by using a laminate including a plated layer forming layer and a temporary protective film on both surfaces of the substrate.

[Method for Producing Metal Layer-Containing Laminate]

Next, a method for producing a metal layer-containing laminate according to a third embodiment of the present invention will be described in detail. The method for producing a metal layer-containing laminate includes a step in which a plating catalyst or a precursor thereof is applied to the patterned plated layer of the substrate with a patterned plated layer, the patterned plated layer to which a plating catalyst or a precursor thereof has been applied to is subjected to a plating treatment to thereby form a metal layer on the patterned plated layer (hereinafter, also referred to as "metal layer forming step").

As the members and materials for forming the patterned plated layer used in the present embodiment, and the method for producing a substrate with a patterned plated layer, the above-mentioned members, materials and production method can be appropriately used. Hereinafter, the procedure of the metal layer forming step will be described.

[Metal Layer Forming Step]

Figure 8:
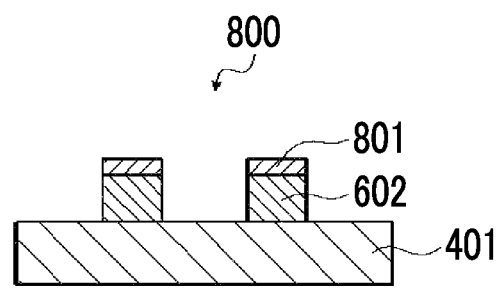
FIG. 8 is a cross-sectional view showing a method for producing a metal layer-containing laminate according to a third embodiment of the present invention.

The present step is a step in which a plating catalyst or a precursor thereof is applied to a patterned plated layer in a substrate with a patterned plated layer, and the patterned plated layer to which the plating catalyst or the precursor thereof has been applied is subjected to a plating treatment to thereby form a metal layer on the patterned plated layer. More specifically, by carrying out the present step, as shown in FIG. 8, a metal layer 801 is formed on the patterned plated layer 602, and therefore a metal layer-containing laminate 800 is obtained.

Hereinafter, a step of applying a plating catalyst or a precursor thereof to the patterned plated layer (step X), and a step of subjecting the patterned plated layer to which the plating catalyst or the precursor thereof has been applied to a plating treatment (step Y) will be described separately.

<Step X: Plating Catalyst Applying Step>

In the present step, first, a plating catalyst or a precursor thereof is applied to a patterned plated layer. The interactive group derived from the aforementioned compound adsorbs the applied plating catalyst or a precursor thereof, according to the function thereof. More specifically, the plating catalyst or the precursor thereof is applied in the patterned plated layer and on the surface of the patterned plated layer.

The plating catalyst or the precursor thereof functions as a catalyst and an electrode of the plating treatment. Therefore, the type of the plating catalyst or the precursor thereof to be used is appropriately determined in accordance with the type of the plating treatment.

Further, the plating catalyst or the precursor thereof to be used is preferably an electroless plating catalyst or a precursor thereof. Hereinafter, an electroless plating catalyst or a precursor thereof will be described in detail.

The electroless plating catalyst used in the present step is not particularly limited as long as it serves as an active nucleus during electroless plating. Specifically, a metal containing a catalytic capacity of the autocatalytic reduction reaction (which is known as a metal capable of electroless plating with lower ionization tendency than Ni) may be used. Specific examples thereof include Pd, Ag, Cu, Ni, Pt, Au, and Co. Among them, preferred is Ag, Pd, Pt, or Cu from the viewpoint of high catalytic capacity.

A metallic colloid may be used as the electroless plating catalyst.

The electroless plating catalyst precursor in the present step can be used without any particular limitation as long as it may be converted into the electroless plating catalyst by a chemical reaction. Metal ions of the metals illustrated above for the electroless plating catalyst are mainly used. The metal ions which are the electroless plating catalyst precursors are converted by the reduction reaction into zero-valent metals which are the electroless plating catalysts. After the metal ion as the electroless plating catalyst precursor is applied to the patterned plated layer, the electroless plating catalyst precursor may be separately converted into a zero-valent metal as the electroless plating catalyst by the reduction reaction before being immersed in an electroless plating bath. Alternatively, the electroless plating catalyst precursor may be immersed into the electroless plating bath without any treatment to be converted into a metal (electroless plating catalyst) by the action of a reducing agent in the electroless plating bath.

A metal salt is preferably used to apply the metal ion as the electroless plating catalyst precursor to the patterned plated layer. The metal salt used is not particularly limited as long as it dissolves in an appropriate solvent to be dissociated into a metal ion and a base (anion). Examples thereof include $M(NO_3)_n$, $MCl_n$, $M_{2/n}(SO_4)$, and $M_{3/n}(PO_4)$ (where M represents an n-valent metal atom). The metal ion resulting from the dissociation of the metal salt may be suitably used. Examples of the metal ion include Ag ion, Cu ion, Ni ion, Co ion, Pt ion, and Pd ion. Among them, ions capable of multidentate coordination are preferred. Particularly, Ag ion, Pd ion, or Cu ion is more preferred from the viewpoint of the number of types of functional groups capable of coordination and the catalytic capacity.

In the present step, a zero-valent metal may be used as the catalyst used for carrying out direct electroplating without electroless plating.

Examples of the method of applying a plating catalyst or a precursor thereof to a patterned plated layer include a method which involves preparing a solution of a plating catalyst or a precursor thereof dispersed or dissolved in an appropriate solvent (catalyst-providing liquid containing a plating catalyst or a precursor thereof and a solvent), and applying the solution to the patterned plated layer and a method which involves immersing the laminate having the patterned plated layer formed thereon in the solution.

Water and/or an organic solvent are appropriately used for the solvent above. The organic solvent is preferably a solvent which can permeate into a patterned plated layer, and examples thereof include acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetin, diethylene glycol diacetate, dioxane, N-methylpyrrolidone, dimethyl carbonate, and dimethyl cellosolve.

The pH of the catalyst-providing liquid containing a plating catalyst or a precursor thereof and a solvent is not particularly limited, but it is preferably 3.0 to 7.0, more preferably 3.2 to 6.8, and still more preferably 3.5 to 6.6 from the viewpoint of easy formation of a metal layer in a desired amount at a desired position at the time of a plating treatment.

The method for preparing a catalyst-providing liquid is not particularly limited, and a predetermined metal salt may be dissolved in an appropriate solvent, and if necessary, the pH may be adjusted to a predetermined range using an acid or an alkali.

The concentration of the plating catalyst or the precursor thereof in the solution is not particularly limited, but it is preferably 0.001% to 50% by mass and more preferably 0.005% to 30% by mass.

The time during which the plated layer is brought into contact with the plating catalyst or the precursor thereof (hereinafter, also referred to as "contact time") is preferably about 30 seconds to 24 hours and more preferably about 1 minute to 1 hour.

The adsorbed amount of the plating catalyst or the precursor thereof of the patterned plated layer varies depending on a plating bath species to be used, a catalyst metal species, an interactive group species of a patterned plated layer, usage and the like, but it is preferably 5 to 1,000 $mg/m^2$, more preferably 10 to 800 $mg/m^2$, and still more preferably 20 to 600 $mg/m^2$ from the viewpoint of a deposition property of plating.

<Step Y: Plating Treatment Step>

Next, a plating treatment is carried out on the patterned plated layer to which a plating catalyst or a precursor thereof has been applied.

The method of a plating treatment is not particularly limited, and examples thereof include an electroless plating treatment and an electrolytic plating treatment (electroplating treatment). In the present step, an electroless plating treatment may be carried out alone, or an electrolytic plating treatment may be further carried out following an electroless plating treatment.

In the present specification, a so-called silver mirror reaction is included as one type of the above-mentioned electroless plating treatment. Thus, a desired patterned metal layer may be formed by reducing the adhered metal ions, for example, by a silver mirror reaction or the like, and thereafter an electrolytic plating treatment may be further carried out.

Hereinafter, the procedure of the electroless plating treatment and electrolytic plating treatment will be described in detail.

The electroless plating treatment refers to an operation of depositing metals through a chemical reaction using a solution of metal ions to be deposited as plating dissolved therein.

For example, the electroless plating in the present step is preferably carried out in such a manner that a laminate having the patterned plated layer to which an electroless plating catalyst has been applied is washed with water to remove an excess of the electroless plating catalyst (metal), and then immersed in an electroless plating bath. As the electroless plating bath to be used, a known electroless plating bath may be employed.

Further, in the case where a substrate having the patterned plated layer to which an electroless plating catalyst precursor has been applied is immersed in an electroless plating bath in a state of an electroless plating catalyst precursor being adsorbed or impregnated in the patterned plated layer, it is preferred that a laminate is washed with water to remove an excess of the electroless plating catalyst precursor (such as a metal salt), and then immersed in the electroless plating bath. In this case, the reduction of the electroless plating catalyst precursor and subsequently the electroless plating are carried out in the electroless plating bath. Also with respect to the electroless plating bath used herein, a known electroless plating bath may be employed in the same manner as described above.

Further, apart from the aspect of using an electroless plating liquid as described above, the reduction of an electroless plating catalyst precursor can also be carried out with the preparation of a catalyst activating liquid (reducing liquid), as a separate step prior to electroless plating.

Typically, the composition of the electroless plating bath mainly includes 1. metal ions for plating, 2. reducing agent, and 3. additive (stabilizer) that improves the stability of metal ions in addition to a solvent (for example, water). In addition to these, the plating bath may include a known additive such as a stabilizer for a plating bath.

The organic solvent used for the electroless plating bath is required to be a solvent which is soluble in water. From this viewpoint, ketones such as acetone; or alcohols such as methanol, ethanol, and isopropanol are preferable. As the type of metal used for the electroless plating bath, copper, tin, lead, nickel, gold, silver, palladium, or rhodium is known. Among them, from the viewpoint of conductivity, copper, silver, or gold is preferable and copper is more preferable. Further, an optimal reducing agent and/or an optimal additive is selected according to the metal.

The immersion time in the electroless plating bath is preferably 1 minute to 6 hours and more preferably 1 minute to 3 hours.

In the present step, in the case where a plating catalyst or a precursor thereof that has been applied to the patterned plated layer functions as an electrode, electroplating can be carried out on the patterned plated layer to which the catalyst or the precursor thereof has been applied.

As described above, in the present step, if necessary, an electrolytic plating treatment may be carried out after the electroless plating treatment. In such an aspect, the thickness of a metal layer to be formed is appropriately adjustable.

Any method known in the related art may be used for electroplating. Examples of the metal that may be used in electroplating include copper, chromium, lead, nickel, gold, silver, tin, and zinc. From the viewpoint of conductivity, copper, gold or silver is preferred and copper is more preferred.

By carrying out the above-mentioned steps, it is possible to form a metal layer (plating layer) on a patterned plated layer.

In the case where a subtractive method is used for forming the metal layer, because plated layers composed of a hydrophilic resin or the like are present between the patterned metal layers, it is easy to cause migration of metal ions due to the influence of the plated layers between the metal layers in the case where the pattern of the metal layers is finer, and therefore there is a concern that insulation properties are lowered (the formation of a metal layer by a subtractive method is described in JP2012-097296A or the like). On the other hand, the above-mentioned procedure of the present invention is a so-called additive method in which a patterned plated layer is formed, and a metal layer corresponding to a conductive layer is formed on the patterned plated layer. Since plated layers do not remain between metal layers in a metal layer-containing laminate which is obtained by this method, occurrence of metal ion migration is further suppressed and therefore such a laminate can be suitably used as an electroconductive film for a touch panel sensor.

Figure 9:
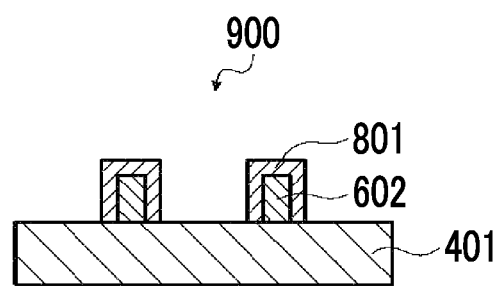
FIG. 9 is a cross-sectional view showing a modified example of the metal layer-containing laminate according to the third embodiment of the present invention.

Although FIG. 8 shows an aspect in which the metal layer 801 is disposed only on the upper surface of the patterned plated layer 602, without being limited to this aspect, as shown in FIG. 9, there may be a metal layer-containing laminate (900) in which the metal layer 801 is disposed on a surface other than the contact surface of the patterned plated layer 602 with the substrate 401. That is, the metal layer may be disposed so as to cover the surface other than the contact surface of the patterned plated layer with the substrate.

In the above description, the aspect in which the patterned plated layer is disposed on one surface of the substrate and the metal layer is further formed thereon has been shown, but it is also possible to dispose the patterned plated layer on both surfaces of the substrate and further form the metal layer thereon.

[Applications]

The metal layer-containing laminate obtained by the foregoing treatment can be applied to various uses and can be applied to various applications such as a touch panel (or a touch panel sensor), a semiconductor chip, various electric wiring boards, a flexible printed circuit (FPC), a chip on film (COF), a tape automated bonding (TAB), an antenna, a multilayer wiring board, and a mother board. Among them, it is preferable to use such a laminate for a touch panel sensor (electrostatic capacitance touch panel sensor). In the case where the metal layer-containing laminate is applied to a touch panel sensor, the metal layer in the metal layer-containing laminate functions as a detection electrode or a lead-out wiring in the touch panel sensor.

In the present specification, a combination of a touch panel sensor and various display devices (for example, a liquid crystal display device and an organic electro-luminescence (EL) display device) is called a touch panel. The touch panel is preferably, for example, a so-called electrostatic capacitance touch panel.

EXAMPLES

Hereinafter, the present invention will be described in more detail with reference to Examples. The materials, the use amounts, the ratios, the treatment contents, the treatment procedures, and the like shown in the following Examples can be appropriately changed without departing from the gist of the present invention. Therefore, the scope of the present invention should not be limitatively interpreted by the following Examples.

[Production of Substrate]
[Production of Substrate S1-1]

ZF14 (ZEONOR film, manufactured by Zeon Corporation) was dissolved in toluene, and ultraviolet absorber 1 (UVSORB 101, manufactured by Fujifilm Fine Chemicals Co., Ltd.) was added so as to be 2% by mass in the resin component to produce a coating liquid. Using the coating liquid, a substrate S1-1 was produced so as to have a thickness of 100 μm. The structure of the ultraviolet absorber 1 is shown below.

Ultraviolet Absorber 1

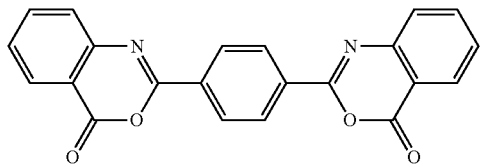 [SMILES: O=c1oc(-c2ccc(-c3nc4ccccc4c(=O)o3)cc2)nc2ccccc12]

[Production of Substrate S1-2]

A substrate formed in the same manner as in S1-1 except that F5023 (ARTON film, manufactured by JSR Corporation) was dissolved in toluene and UV absorber 1 was added so as to be 2% by mass in the resin component was designated as S1-2.

[Production of Substrate S1-3]

A substrate formed by heating and melting pelletized PET to 300° C. to produce a melt, and extruding the melt so as to have a thickness of 100 μm was designated as S1-3.

[Production of Substrate S1-4]

A substrate formed by heating and melting pelletized PET to 300° C. to produce a melt, and adding ultraviolet absorber 1 to the melt so as to be 2% by mass in the resin component such that the film has a thickness of 100 μm was designated as S1-4.

[Production of Primer Layer Forming Composition]

A liquid obtained by dissolving 100 g of hydrogenated nitrile butadiene rubber Zetpol 0020 (manufactured by Zeon Corporation) in 900 g of cyclopentanone (manufactured by Tokyo Chemical Industry Co., Ltd.) was used as a primer layer forming composition.

[Production of Composition for Forming Plated Layer Forming Layer]

<Preparation of Composition for Forming Plated Layer Forming Layer (Hereinafter, Simply Referred to as "Plated Layer Forming Composition") 1>

| | |
|---|---|
| 2-propanol | 96.85% by mass |
| Polyacrylic acid | 0.82% by mass |
| FFM-2 | 2.18% by mass |
| (manufactured by Wako Pure Chemical Industries, Ltd.) | |
| IRGACURE 127 | 0.15% by mass |
| (manufactured by BASF Corporation) | |

The above composition was mixed to obtain a plated layer forming composition 1. In addition, the structure of FFM-2 is shown in Formula (A).

FFM-2

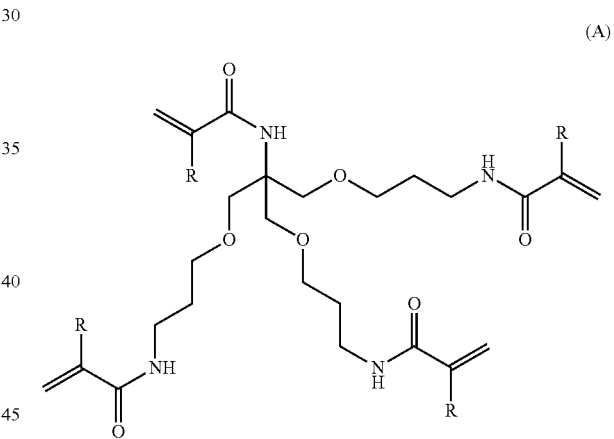

(A)

<Preparation of Plated Layer Forming Composition 2>

| | |
|---|---|
| 2-propanol | 96.85% by mass |
| Polyacrylic acid | 0.82% by mass |
| FFM-2 | 2.18% by mass |
| (manufactured by Wako Pure Chemical Industries, Ltd.) | |
| IRGACURE OχE02 | 0.15% by mass |
| (manufactured by BASF Corporation) | |

The above composition was mixed to obtain a plated layer forming composition 2.

<Preparation of Plated Layer Forming Composition 3>

| | |
|---|---|
| 2-propanol | 96.85% by mass |
| Polyacrylic acid | 0.82% by mass |
| FFM-2 | 2.18% by mass |
| (manufactured by Wako Pure Chemical Industries, Ltd.) | |

-continued

| IRGACURE 819 (manufactured by BASF Corporation) | 0.075% by mass |
| IRGACURE 184 (manufactured by BASF Corporation) | 0.075% by mass |

The above composition was mixed to obtain a plated layer forming composition 3.

<Preparation of Plated Layer Forming Composition 4>

| 2-propanol | 96.85% by mass |
| Polymer 1 | 3% by mass |
| IRGACURE OXE 02 (manufactured by BASF Corporation) | 0.15% by mass |

The above composition was mixed to obtain a plated layer forming composition 4. In addition, the structure of Polymer 1 is shown below.

Polymer 1

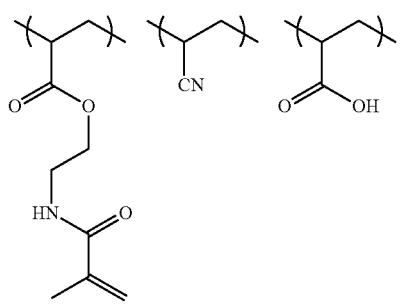

The polymer 1 was synthesized by the following method.

1 L of ethyl acetate and 159 g of 2-aminoethanol were charged into a 2 L three-neck flask which was then cooled in an ice bath. The internal temperature of the system was adjusted to 20° C. or lower, and 150 g of 2-bromoisobutyrate bromide was added dropwise thereto. Then, the internal temperature was elevated to room temperature (25° C.), followed by reaction for 2 hours. After the reaction was completed, 300 mL of distilled water was added to the reaction solution to stop the reaction. Thereafter, the ethyl acetate phase was washed 4 times with 300 mL of distilled water and dried over magnesium sulfate, and ethyl acetate was further distilled off to obtain 80 g of a raw material A.

Next, 47.4 g of raw material A, 22 g of pyridine, and 150 mL of ethyl acetate were charged into a 500 mL three-neck flask which was then cooled in an ice bath. The internal temperature of the system was adjusted to 20° C. or lower, and 25 g of acrylic acid chloride was added dropwise thereto. Then, the internal temperature was elevated to room temperature, followed by reaction for 3 hours. After the reaction was completed, 300 mL of distilled water was added to the reaction solution to stop the reaction. Thereafter, the ethyl acetate phase was washed 4 times with 300 mL of distilled water and dried over magnesium sulfate, and ethyl acetate was further distilled off. Then, column chromatography was carried out to obtain the following monomer M1 (20 g). In addition, the structure of the monomer M1 is shown below.

Monomer M1

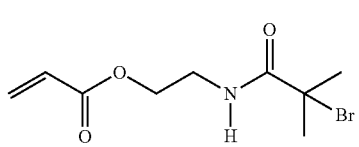

8 g of N,N-dimethylacetamide was charged into a 500 mL three-neck flask which was then heated to 65° C. under a nitrogen stream. A solution of 14.3 g of monomer M1, 3.0 g of acrylonitrile (manufactured by Tokyo Chemical Industry Co., Ltd.), 6.5 g of acrylic acid (manufactured by Tokyo Chemical Industry Co., Ltd.), and 0.4 g of V-65 (manufactured by Wako Pure Chemical Industries, Ltd.) in 8 g of N,N-dimethylacetamide was added dropwise thereto over 4 hours.

After the dropwise addition was completed, the reaction solution was further stirred for three hours. Then, 41 g of N,N-dimethylacetamide was added, and the reaction solution was cooled to room temperature. 0.09 g of 4-hydroxy TEMPO (manufactured by Tokyo Chemical Industry Co., Ltd.), and 54.8 g of diazabicycloundecene (DBU) were added to the above reaction solution, followed by reaction at room temperature for 12 hours. Thereafter, 54 g of a 70% by mass aqueous methanesulfonic acid solution was added to the reaction solution. After the reaction was completed, re-precipitation was carried out with water and the solids were removed to obtain 12 g of polymer 1.

Identification of the resulting polymer 1 was carried out using an infrared radiation (IR) meter (manufactured by Horiba Ltd.). The measurement was carried out by dissolving a polymer in acetone and using KBr crystals. As a result of IR measurement, a peak was observed near 2,240 cm$^{-1}$ and therefore it was found that acrylonitrile, which is a nitrile unit, has been introduced into the polymer. Further, it was found through an acid value measurement that acrylic acid has been introduced as a carboxylic acid unit. In addition, the polymer was dissolved in heavy dimethyl sulfoxide (DMSO), followed by measurement with a 300 MHz $^1$H nuclear magnetic resonance (NMR) spectrometer (AV-300, manufactured by Bruker Co., Ltd.). A peak corresponding to the nitrile unit was broadly observed in 2.5-0.7 ppm (5H fraction), a peak corresponding to the polymerizable group unit was broadly observed in 7.8-8.1 ppm (1H fraction), 5.8-5.6 ppm (1H fraction), 5.4-5.2 ppm (1H fraction), 4.2-3.9 ppm (2H fraction), 3.3-3.5 ppm (2H fraction), and 2.5-0.7 ppm (6H fraction), a peak corresponding to the carboxylic acid group-containing unit was broadly observed in 2.5-0.7 ppm (3H fraction), and the polymerizable group unit:nitrile unit:carboxylic acid unit was found to be 30:30:40 (mol %).

Example 1

On the surface of one side of the substrate S1-3, a primer layer forming composition was applied with a bar coater so that the thickness after drying was 1 μm to produce a coating film. This coating film was dried in an oven at 140° C. for 10 minutes to form a primer layer on the surface on one side of the substrate. Thereafter, on the primer layer, the plated layer forming composition 1 was applied with a bar coater so that the thickness after drying was 0.5 μm to produce a coating film. This coating film was dried in an oven at 80° C. for 2 minutes to obtain a plated layer forming layer. Thereafter, F5023 (thickness: 100 μm) as a temporary protective film was laminated on the plated layer forming layer to obtain a laminate. Next, a photo mask capable of simultaneously forming both a lattice-like mesh pattern of 150 µm square with a wiring width of 2 µm and a pattern in which a plurality of straight lines having a wiring width of 1 mm are disposed in parallel at intervals of 2 mm was brought into close contact with the temporary protective film which was then exposed to light at an exposure energy of 4,500 mJ using a Deep UV Lamp (manufactured by Ushio Inc.) which is a UV lamp capable of emitting the outgoing light containing light having a wavelength of 300 nm or shorter. Thereafter, the temporary protective film was peeled off from the laminate, and the laminate from which the temporary protective film was removed was immersed in an aqueous 1% by mass sodium carbonate solution heated to 40° C. for 5 minutes to carry out development, thereby obtaining a substrate with a patterned plated layer.

This substrate with a patterned plated layer was immersed in a 5-fold dilution of only the MAT-2A of the Pd catalyst-providing liquid MAT-2 (manufactured by Uyemura & Co., Ltd.) at room temperature for 5 minutes, and pulled up and then washed twice with pure water. Then, the substrate with a patterned plated layer after washing was immersed in a reducing agent MAB (manufactured by Uyemura & Co., Ltd.) at 36° C. for 5 minutes, and pulled up and then washed twice with pure water. Thereafter, the substrate with a patterned plated layer after washing was immersed in an electroless plating liquid THRU-CUP PEA (manufactured by Uyemura & Co., Ltd.) at room temperature for 60 minutes, and pulled up and then washed with pure water, thereby obtaining a metal layer-containing laminate. It should be noted that the metal layer can be used as a wiring for a touch panel.

Example 2

A metal layer-containing laminate was produced in the same manner as in Example 1, except that the substrate was changed to S1-1, the plated layer forming composition 1 was changed to the plated layer forming composition 2, the temporary protective film was changed to ZF14 (thickness: 100 µm), and the exposure amount was changed to 300 mJ.

Example 3

A metal layer-containing laminate was produced in the same manner as in Example 1, except that the substrate was changed to S1-1, the plated layer forming composition 1 was changed to the plated layer forming composition 2, the temporary protective film was changed to 16QS62 (PET film, thickness: 16 µm, manufactured by Toray Industries, Inc.), and the exposure amount was changed to 300 mJ.

Example 4

A metal layer-containing laminate was produced in the same manner as in Example 1, except that the substrate was changed to S1-2, the plated layer forming composition 1 was changed to the plated layer forming composition 2, and the exposure amount was changed to 300 mJ.

Example 5

A metal layer-containing laminate was produced in the same manner as in Example 1, except that the substrate was changed to S1-2, the plated layer forming composition 1 was changed to the plated layer forming composition 2, the temporary protective film was changed to 16QS62 (PET film, thickness: 16 µm, manufactured by Toray Industries, Inc.), and the exposure amount was changed to 300 mJ.

Example 6

A metal layer-containing laminate was produced in the same manner as in Example 1, except that the substrate was changed to S1-4, the plated layer forming composition 1 was changed to the plated layer forming composition 2, and the exposure amount was changed to 300 mJ.

Example 7

A metal layer-containing laminate was produced in the same manner as in Example 1, except that the substrate was changed to S1-4, the plated layer forming composition 1 was changed to the plated layer forming composition 2, the temporary protective film was changed to 16QS62 (PET film, thickness: 16 µm, manufactured by Toray Industries, Inc.), and the exposure amount was changed to 300 mJ.

Example 8

A metal layer-containing laminate was produced in the same manner as in Example 1, except that the substrate was changed to S1-4, the plated layer forming composition 1 was changed to the plated layer forming composition 4, the temporary protective film was changed to 16QS62 (PET film, thickness: 16 µm, manufactured by Toray Industries, Inc.), and the exposure amount was changed to 300 mJ.

Comparative Example 1

A metal layer-containing laminate was produced in the same manner as in Example 1, except that the substrate was changed to ZF14 (thickness: 100 µm), the plated layer forming composition 1 was changed to the plated layer forming composition 2, the temporary protective film was changed to ZF14 (thickness: 100 µm), and the exposure amount was changed to 300 mJ.

Comparative Example 2

A metal layer-containing laminate was produced in the same manner as in Example 1, except that the substrate was changed to F5023 (thickness: 100 µm), the plated layer forming composition 1 was changed to the plated layer forming composition 2, and the exposure amount was changed to 300 mJ.

Comparative Example 3

A metal layer-containing laminate was produced in the same manner as in Example 1, except that the plated layer forming composition 1 was changed to the plated layer forming composition 2, and the exposure amount was changed to 300 mJ.

Comparative Example 4

A metal layer-containing laminate was produced in the same manner as in Example 1, except that the plated layer forming composition 1 was changed to the plated layer forming composition 2, the temporary protective film was changed to 16QS62 (PET film, thickness: 16 µm, manufactured by Toray Industries, Inc.), and the exposure amount was changed to 300 mJ.

Comparative Example 5

A metal layer-containing laminate was produced in the same manner as in Example 1, except that the substrate was changed to S1-1, the plated layer forming composition 1 was changed to the plated layer forming composition 3, the temporary protective film was changed to ZF14 (thickness: 100 μm), and the exposure amount was changed to 3,000 mJ.

Comparative Example 6

A metal layer-containing laminate was produced in the same manner as in Example 1, except that the substrate was changed to S1-1, the plated layer forming composition 1 was changed to the plated layer forming composition 3, the temporary protective film was changed to 16QS62 (PET film, thickness: 16 μm, manufactured by Toray Industries, Inc.), and the exposure amount was changed to 3,000 mJ.

Comparative Example 7

A metal layer-containing laminate was produced in the same manner as in Example 1, except that the substrate was changed to S1-2, the plated layer forming composition 1 was changed to the plated layer forming composition 3, and the exposure amount was changed to 3,000 mJ.

Comparative Example 8

A metal layer-containing laminate was produced in the same manner as in Example 1, except that the substrate was changed to S1-2, the plated layer forming composition 1 was changed to the plated layer forming composition 3, the temporary protective film was changed to 16QS62 (PET film, thickness: 16 μm, manufactured by Toray Industries, Inc.), and the exposure amount was changed to 300 mJ.

Comparative Example 9

A metal layer-containing laminate was produced in the same manner as in Example 1, except that the substrate was changed to S1-4, the plated layer forming composition 1 was changed to the plated layer forming composition 3, and the exposure amount was changed to 3,000 mJ.

Comparative Example 10

A metal layer-containing laminate was produced in the same manner as in Example 1, except that the substrate was changed to S1-4, the plated layer forming composition 1 was changed to the plated layer forming composition 3, the temporary protective film was changed to 16QS62 (PET film, thickness: 16 μm, manufactured by Toray Industries, Inc.), and the exposure amount was changed to 3,000 mJ.

The positions (nm) of the absorption edge $\lambda_0$ on the long wavelength side of the ultraviolet-visible absorption spectrum of the temporary protective film, the absorption edge $\lambda_1$ on the long wavelength side of the ultraviolet-visible absorption spectrum of the polymerization initiator, and the absorption edge $\lambda_2$ on the long wavelength side of the ultraviolet-visible absorption spectrum of the substrate in each of the above Examples and the Comparative Examples are summarized in Table 1. The method of determining these absorption edges is as described above.

[Evaluation of Wiring Thickening]

The pattern shape of the metal wiring of the metal layer-containing laminate of each of Examples and the Comparative Examples was visually confirmed to evaluate the wiring thickening. The evaluation is carried out according to the following standards and the evaluation "B" or higher is practically preferable. The results are summarized in Table 1.

(Evaluation Standards)

In a pattern in which a plurality of straight lines having a wiring width of 1 mm are disposed in parallel at intervals of 2 mm, A: Wiring thickening is less than 0.5 mm.
B: Wiring thickening is 0.5 mm or more and less than 0.75 mm.
C: Wiring thickening is 0.75 mm or more and less than 1 mm.
D: Wiring thickening is 1 mm or more and less than 1.25 mm.
E: Wiring thickening is 1.25 mm or more.

TABLE 1

| | Temporary protective film | | | Plated layer forming composition | | | Substrate | | | | |
|---|---|---|---|---|---|---|---|---|---|---|---|
| | Material | Thickness (μm) | $\lambda_0$ (nm) | Composition | Thickness (μm) | $\lambda_1$ (nm) | Material | Thickness (μm) | $\lambda_2$ (nm) | Exposure amount (mJ) | Wiring thickening |
| Example 1 | F5023 | 100 | 237 | 1 | 0.5 | 278 | S1-3 | 100 | 312 | 4500 | A |
| Example 2 | ZF14 | 100 | 230 | 2 | 0.5 | 381 | S1-1 | 100 | 385 | 300 | A |
| Example 3 | PET | 16 | 312 | 2 | 0.5 | 381 | S1-1 | 100 | 385 | 300 | A |
| Example 4 | F5023 | 100 | 237 | 2 | 0.5 | 381 | S1-2 | 100 | 385 | 300 | A |
| Example 5 | PET | 16 | 312 | 2 | 0.5 | 381 | S1-2 | 100 | 385 | 300 | A |
| Example 6 | F5023 | 100 | 237 | 2 | 0.5 | 381 | S1-4 | 100 | 385 | 300 | A |
| Example 7 | PET | 16 | 312 | 2 | 0.5 | 381 | S1-4 | 100 | 385 | 300 | A |
| Example 8 | PET | 16 | 312 | 4 | 0.5 | 381 | S1-4 | 100 | 385 | 300 | B |
| Comparative Example 1 | ZF14 | 100 | 230 | 2 | 0.5 | 381 | ZF14 | 100 | 230 | 300 | E |
| Comparative Example 2 | F5023 | 100 | 237 | 2 | 0.5 | 381 | F5023 | 100 | 237 | 300 | E |
| Comparative Example 3 | F5023 | 100 | 237 | 2 | 0.5 | 381 | S1-3 | 100 | 312 | 300 | D |
| Comparative Example 4 | PET | 16 | 312 | 2 | 0.5 | 381 | S1-3 | 100 | 312 | 300 | D |
| Comparative Example 5 | ZF14 | 100 | 230 | 3 | 0.5 | 410 | S1-1 | 100 | 385 | 3000 | C |
| Comparative Example 6 | PET | 16 | 312 | 3 | 0.5 | 410 | S1-1 | 100 | 385 | 3000 | C |
| Comparative Example 7 | F5023 | 100 | 237 | 3 | 0.5 | 410 | S1-2 | 100 | 385 | 3000 | C |
| Comparative Example 8 | PET | 16 | 312 | 3 | 0.5 | 410 | S1-2 | 100 | 385 | 300 | C |
| Comparative Example 9 | F5023 | 100 | 237 | 3 | 0.5 | 410 | S1-4 | 100 | 385 | 3000 | C |
| Comparative Example 10 | PET | 16 | 312 | 3 | 0.5 | 410 | S1-4 | 100 | 385 | 3000 | C |

From the results shown in Table 1, it was found that the laminate of each of Examples 1 to 8, which is a laminate including a substrate, a plated layer forming layer, and a temporary protective film in this order, in which the plated layer forming layer contains a polymerization initiator and Compound X or Composition Y as described above, the absorption edge $\lambda_0$ on the long wavelength side of the ultraviolet-visible absorption spectrum of the temporary protective film, the absorption edge $\lambda_1$ on the long wavelength side of the ultraviolet-visible absorption spectrum of the polymerization initiator, and the absorption edge $\lambda_2$ on the long wavelength side of the ultraviolet-visible absorption spectrum of the substrate satisfy the relationship represented by Expression (Z), has the effect of the present invention. On the other hand, it was found that the laminate described in each of Comparative Examples 1 to 10, in which $\lambda_0$, $\lambda_1$, and $\lambda_2$ do not satisfy the predetermined relationship, does not have the effect of the present invention.

It was found that the laminate of Example 7 containing a predetermined Composition Y in the plated layer forming layer was suppressed in wiring thickening more than the laminate of Example 8 not containing Composition Y.

EXPLANATION OF REFERENCES

100: laminate
101: substrate
102: plated layer forming layer
103: temporary protective film
201: photo mask
400: laminate
401: substrate
402: plated layer forming layer
403: temporary protective film
501: photo mask
502: irradiated region
600: laminate
601: non-irradiated region
700: substrate with patterned plated layer
800: metal layer-containing laminate
801: metal layer
900: metal layer-containing laminate

What is claimed is:

1. A laminate comprising, in order:
a substrate;
a plated layer forming layer; and
a temporary protective film,
wherein the plated layer forming layer contains a polymerization initiator and Compound X or Composition Y shown below, and
an absorption edge $\lambda_0$ on the long wavelength side of an ultraviolet-visible absorption spectrum of the temporary protective film,
an absorption edge $\lambda_1$ on the long wavelength side of an ultraviolet-visible absorption spectrum of the polymerization initiator,
an absorption edge $\lambda_2$ on the long wavelength side of an ultraviolet-visible absorption spectrum of the substrate satisfy the relationship represented by Expression (Z),
the substrate contains an ultraviolet absorber, $$\lambda_0 < \lambda_1 < \lambda_2 \qquad \text{Expression (Z):}$$

Compound X: a compound containing a functional group capable of interacting with a plating catalyst or a precursor thereof, and a polymerizable group, and
Composition Y: a composition including a compound containing a functional group capable of interacting with a plating catalyst or a precursor thereof, and a compound containing a polymerizable group.

2. The laminate according to claim 1,
wherein the substrate is a resin substrate containing a resin $P_1$ and the resin $P_1$ contains an aromatic group, and
the temporary protective film is a film containing a resin $P_2$ and the resin $P_2$ does not contain an aromatic group.

3. The laminate according to claim 2, wherein the resin $P_1$ contains at least one selected from the group consisting of polyethylene terephthalate and polycarbonate.

4. The laminate according to claim 3, wherein the resin $P_1$ is polyethylene terephthalate.

5. A method for producing a substrate with a patterned plated layer, comprising:
a step of irradiating the plated layer forming layer with light in a patternwise manner from the temporary protective film side in the laminate according to claim 1;
a step of removing the temporary protective film on the plated layer forming layer; and
a step of removing a region not irradiated with light in the plated layer forming layer to form a patterned plated layer on the substrate.

6. A method for producing a metal layer-containing laminate, comprising:
a step of irradiating the plated layer forming layer with light in a patternwise manner from the temporary protective film side in the laminate according to claim 1;
a step of removing the temporary protective film on the plated layer forming layer;
a step of removing a region not irradiated with light in the plated layer forming layer to form a patterned plated layer on the substrate; and
a step of applying a plating catalyst or a precursor thereof to the patterned plated layer and subjecting the patterned plated layer to which the plating catalyst or the precursor thereof is applied to a plating treatment to form a metal layer on the patterned plated layer.

7. A touch panel sensor comprising:
a metal layer-containing laminate obtained by the production method according to claim 6.

8. A touch panel comprising:
a metal layer-containing laminate obtained by the production method according to claim 6.

9. A method for producing a substrate with a patterned plated layer, comprising:
a step of irradiating the plated layer forming layer with light in a patternwise manner from the temporary protective film side in the laminate according to claim 2;
a step of removing the temporary protective film on the plated layer forming layer; and
a step of removing a region not irradiated with light in the plated layer forming layer to form a patterned plated layer on the substrate.

10. A method for producing a substrate with a patterned plated layer, comprising:
a step of irradiating the plated layer forming layer with light in a patternwise manner from the temporary protective film side in the laminate according to claim 3;
a step of removing the temporary protective film on the plated layer forming layer; and
a step of removing a region not irradiated with light in the plated layer forming layer to form a patterned plated layer on the substrate.

11. A method for producing a substrate with a patterned plated layer, comprising:

a step of irradiating the plated layer forming layer with light in a patternwise manner from the temporary protective film side in the laminate according to claim 4;

a step of removing the temporary protective film on the plated layer forming layer; and a step of removing a region not irradiated with light in the plated layer forming layer to form a patterned plated layer on the substrate.

12. A method for producing a metal layer-containing laminate, comprising:

a step of irradiating the plated layer forming layer with light in a patternwise manner from the temporary protective film side in the laminate according to claim 2;

a step of removing the temporary protective film on the plated layer forming layer;

a step of removing a region not irradiated with light in the plated layer forming layer to form a patterned plated layer on the substrate; and a step of applying a plating catalyst or a precursor thereof to the patterned plated layer and subjecting the patterned plated layer to which the plating catalyst or the precursor thereof is applied to a plating treatment to form a metal layer on the patterned plated layer.

13. A method for producing a metal layer-containing laminate, comprising:

a step of irradiating the plated layer forming layer with light in a patternwise manner from the temporary protective film side in the laminate according to claim 3;

a step of removing the temporary protective film on the plated layer forming layer;

a step of removing a region not irradiated with light in the plated layer forming layer to form a patterned plated layer on the substrate; and a step of applying a plating catalyst or a precursor thereof to the patterned plated layer and subjecting the patterned plated layer to which the plating catalyst or the precursor thereof is applied to a plating treatment to form a metal layer on the patterned plated layer.

14. A method for producing a metal layer-containing laminate, comprising:

a step of irradiating the plated layer forming layer with light in a patternwise manner from the temporary protective film side in the laminate according to claim 4;

a step of removing the temporary protective film on the plated layer forming layer;

a step of removing a region not irradiated with light in the plated layer forming layer to form a patterned plated layer on the substrate; and a step of applying a plating catalyst or a precursor thereof to the patterned plated layer and subjecting the patterned plated layer to which the plating catalyst or the precursor thereof is applied to a plating treatment to form a metal layer on the patterned plated layer.

* * * * *